United States Patent
Higaki et al.

(10) Patent No.: US 7,737,562 B2
(45) Date of Patent: Jun. 15, 2010

(54) SEMICONDUCTOR ELEMENT MOUNT, SEMICONDUCTOR DEVICE, IMAGING DEVICE, LIGHT EMITTING DIODE COMPONENT AND LIGHT EMITTING DIODE

(75) Inventors: Kenjiro Higaki, Itami (JP); Daisuke Takagi, Itami (JP); Sadamu Ishidu, Itami (JP); Yasushi Tsuzuki, Itami (JP)

(73) Assignee: A. L. M. T. Corp., Tokyo (JP)

( * ) Notice: Subject to any disclaimer, the term of this patent is extended or adjusted under 35 U.S.C. 154(b) by 254 days.

(21) Appl. No.: 11/987,170

(22) Filed: Nov. 28, 2007

(65) Prior Publication Data

US 2009/0001396 A1 Jan. 1, 2009

Related U.S. Application Data

(63) Continuation of application No. 10/589,747, filed on Aug. 17, 2006, now Pat. No. 7,649,270.

(51) Int. Cl.
H01L 23/48 (2006.01)
H01L 23/52 (2006.01)
H01L 29/40 (2006.01)

(52) U.S. Cl. ............... 257/774; 257/701; 257/773; 257/E23.011; 257/E23.004; 257/E23.009

(58) Field of Classification Search ................ 257/774
See application file for complete search history.

(56) References Cited

U.S. PATENT DOCUMENTS

| | | | |
|---|---|---|---|
| 5,670,797 A | 9/1997 | Okazaki | |
| 5,814,837 A | 9/1998 | Okazaki | |
| 5,882,949 A | 3/1999 | Okazaki | |
| 5,928,768 A | 7/1999 | Ikeda et al. | |
| 6,008,537 A * | 12/1999 | Kosaki et al. | 257/712 |
| 6,114,240 A | 9/2000 | Akram et al. | |
| 6,157,077 A * | 12/2000 | Matsuoka et al. | 257/706 |
| 6,329,671 B1 * | 12/2001 | Tamaki et al. | 257/48 |
| 6,452,278 B1 * | 9/2002 | DiCaprio et al. | 257/777 |
| 7,205,635 B1 * | 4/2007 | MacIntyre | 257/620 |
| 2001/0036506 A1 | 11/2001 | Yamamoto et al. | |
| 2005/0036278 A1 * | 2/2005 | Murakami et al. | 361/600 |

FOREIGN PATENT DOCUMENTS

CN 1414643 A 4/2003

(Continued)

Primary Examiner—David A Zarneke
(74) Attorney, Agent, or Firm—Rabin & Berdo, PC

(57) ABSTRACT

A collective substrate has through-holes. The through-holes each have an interior surface including taper surfaces which are tapered as having an opening size progressively decreasing from a main surface and an external connection surface toward a minimum size hole portion. A semiconductor element mount includes an insulative member cut out of the collective substrate. An imaging device includes an imaging element mounted in a region surrounded by a frame which is bonded to the main surface of the insulative member and closed by a cover. A light emitting diode component includes a light emitting element mounted on the main surface of the insulative member with the minimum size hole portion of the through-hole being filled with an electrically conductive material, the light emitting element being sealed with a fluorescent material and/or a protective resin.

26 Claims, 12 Drawing Sheets

FOREIGN PATENT DOCUMENTS

| | | |
|---|---|---|
| JP | 05-090548 | 4/1993 |
| JP | 07-235621 | 9/1995 |
| JP | 8-213660 | 8/1996 |
| JP | 09-036432 | 2/1997 |
| JP | 11-074410 | 3/1999 |
| JP | 11-135906 | 5/1999 |
| JP | 11-238830 | 8/1999 |
| JP | 2001-94041 | 4/2001 |
| JP | 2002-16341 | 1/2002 |
| JP | 2002-232017 | 8/2002 |
| JP | 2003-282795 | 10/2003 |
| JP | 2004-207592 | 7/2004 |
| JP | 2006-49551 | 2/2006 |

* cited by examiner

SEMICONDUCTOR ELEMENT MOUNT, SEMICONDUCTOR DEVICE, IMAGING DEVICE, LIGHT EMITTING DIODE COMPONENT AND LIGHT EMITTING DIODE

This is a Continuation of U.S. application Ser. No. 10/589,747, filed Aug. 17, 2006, now U.S. Pat No. 7,649,270 the subject matter of which is incorporated herein by reference.

TECHNICAL FIELD

The present invention relates to a ceramic collective substrate configured to include a plurality of insulative members collectively arranged in the same plane, a semiconductor element mount produced by employing an insulative member prepared by cutting the collective substrate into a plurality of regions, semiconductor devices such as an imaging device and a light emitting diode component each produced by employing the semiconductor element mount, and a light emitting diode produced by employing the light emitting diode component.

BACKGROUND ART

With recent prevalence of digital cameras and camera-mounted mobile phones, imaging elements such as CCD imaging elements and C-MOS imaging elements have been increasingly demanded. In order to meet a demand for higher image quality, the imaging elements tend to have a drastically increased number of pixels. Particularly, with prevalence of digital single lens reflex cameras, the imaging elements tend to have an increased size. In recent years, light emitting elements have become capable of emitting a great amount of light or emitting white light with the use of a fluorescent material in combination. Therefore, light emitting diodes employing the light emitting elements are widely used as flashes for the camera-mounted mobile phones.

In order to ensure that the imaging elements, the light emitting elements and like semiconductor elements sufficiently exhibit their capabilities for higher output, there is an increasing demand for a semiconductor element mount employing an insulative member composed of a ceramic material such as AlN having a higher heat dissipating capability. For example, the insulative member of the semiconductor element mount has opposite surfaces which respectively serve as a main surface for mounting a semiconductor element and an external connection surface for connection to a second component. The semiconductor element mount includes a plurality of electrode layers provided on the main surface for mounting the semiconductor element, a plurality of electrode layers provided on the external connection surface for the connection to the second component, and electrically conductive layers or via-conductors respectively provided in a plurality of through-holes extending through the insulative member for individually connecting the electrode layers provided on the main surface to the electrode layers provided on the external connection surface.

Conventionally, the semiconductor element mount is typically produced by a so-called co-firing method employing a ceramic green sheet as a precursor material for the insulative member (see, for example, the following Patent Publications 1 and 2). That is, the ceramic green sheet is formed as having a plane shape corresponding to the outer shape of the insulative member, and through-holes are formed at predetermined positions in the ceramic green sheet. In the case of the via-conductors, an electrically conductive paste to be co-fired with the ceramic green sheet for the formation of the via-conductors is filled in the through-holes. Then, the ceramic green sheet and the electrically conductive paste are simultaneously fired. Thus, the semiconductor element mount is produced.

Further, an electrically conductive paste is, for example, printed or applied in predetermined plane shapes corresponding to the shapes of the electrode layers on opposite surfaces of the ceramic green sheet of a predetermined plane shape later serving as the main surface and the external connection surface of the insulative member, and the electrically conductive paste and the ceramic green sheet are simultaneously fired to form underlying metal layers. Then, metal layers are formed on the underlying metal layers by plating, whereby the electrode layers are formed on the main surface and the external connection surface.

Patent Publication 1: Japanese Unexamined Patent Publication JP, 11-135906, A (1999)

Patent Publication 2: Japanese Unexamined Patent Publication JP, 2002-232017, A

DISCLOSURE OF THE INVENTION

Problems to be Solved by the Invention

However, individual production of each semiconductor element mount by the co-firing method is lower in productivity, and requires higher production costs. Therefore, it is contemplated to produce a plurality of insulative members at a time by preparing a ceramic collective substrate including a plurality of insulative members collectively arranged in the same plane by the aforesaid co-firing method and then cutting the collective substrate into individual regions by dicing or the like. However, a ceramic green sheet having a great area including a plurality of regions defined as the insulative members is liable to be shrunk to a great extent during the firing, and the entire ceramic green sheet is not evenly shrunk. That is, the shrinkage of the ceramic green sheet is uneven. For example, middle portions of edges of a rectangular ceramic green sheet are shrunk inward to a greater extent than corners of the rectangular sheet.

Even if through-holes are formed in the ceramic green sheet so that the regions defined as the insulative members are neatly linearly arranged on the ceramic green sheet before the firing, the through-holes are unevenly displaced due to the shrinkage by the firing. This makes it difficult to cut the resulting collective substrate into the individual regions by dicing or the like. In order to individually cut out the unevenly arranged regions by the dicing or the like, greater spaces are provided between the regions in consideration of the displacement of the respective regions due to the shrinkage. In this case, however, the number of regions to be arranged in the single collective substrate is reduced, and a material loss is increased.

To cope with this, it is contemplated to produce the insulative members by firing a large ceramic green sheet including a plurality of the regions defined as the insulative members to prepare a single collective substrate, defining the plurality of the regions defined as the insulative members in the collective substrate, forming through-holes in the respective regions by a laser process or the like, and cutting the collective substrate into the individual regions. In the aforesaid method, electrode layers are formed on a main surface and an external connection surface of the insulative member by chemical plating, electroplating or the like and, simultaneously with the formation of the electrode layers or before or after the formation of the electrode layers, interior surfaces of the through-holes are metallized for formation of electrically conductive layers connecting the electrode layers on the main surface to the electrode layers on the external connection surface.

However, the through-holes formed by the laser process are each tapered as having a diameter progressively decreasing from a laser incident side toward a laser exit side. Therefore, the interior surface of the through-hole and a surface of the insulative member on the laser exit side meet at an acute angle, so that layers metallized by physical vapor deposition, printing, plating or the like tend to have weaker adhesion or an uneven thickness at an acute angle edge portion. Therefore, poor connection between the electrode layers and the electrically conductive layers is liable to occur when the electrode layers and the electrically conductive layers are formed on the insulative member.

It is an object of the present invention to provide a collective substrate which is produced by firing a ceramic green sheet and then forming a through-hole in the resulting substrate and ensures reliable connection between an electrically conductive layer formed in the through-hole and an electrode layer formed on a main surface or an external connection surface of the collective substrate without a connection failure. It is another object of the present invention to provide a semiconductor element mount produced by employing an insulative member prepared by cutting the collective substrate into individual regions, semiconductor devices such as an imaging device and a light emitting diode component produced by employing the semiconductor element mount, and a light emitting diode produced by employing the light emitting diode component.

Means for Solving the Problems

To achieve the aforementioned objects, a collective substrate according to the present invention is made of a ceramic and formed integrally of a plurality of insulative members arranged in spaced relation in the same plane of the substrate and each having opposite surfaces which respectively serve as a main surface for mounting a semiconductor element and an external connection surface for connection to a second-component, comprising: a through-hole formed at least one of a predetermined position within respective regions defined as the insulative members, and a position across a boundary between the each region and a region outside the region, as extending thicknesswise of the insulative member, wherein the through-hole has a single minimum size hole portion located at a position thicknesswise of the insulative member, and an interior surface tapered such that an opening size progressively decreases from openings of the through-hole in the main surface and in the external connection surface toward the minimum size hole portion. The inventive collective substrate preferably has a heat conductivity of not less than 10 W/mK and a thermal expansion coefficient of not more than $10 \times 10^{-6}/° C$. The inventive collective substrate is preferably produced by firing a planar precursor sheet and then forming through-holes in the resulting substrate. The inventive collective substrate preferably further comprises a semiconductor element mounting electrode layer provided on the main surface in each of the regions defined as the insulative members, a second-component connection electrode layer provided on the external connection surface in each of the regions, and an electrically conductive layer provided in the through-hole for connection between the electrode layer on the main surface and the electrode layer on the external connection surface.

A semiconductor element mount according to the present invention is produced by cutting the inventive collective substrate including the electrode layers and the electrically conductive layers into the individual regions. In the inventive semiconductor element mount, at least an outermost surface portion of the electrode layer on the external connection surface is preferably composed of Au.

The inventive semiconductor element mount preferably comprises an insulative member having a semiconductor element mount region defined on a main surface thereof, and a frame provided on the main surface of the insulative member as surrounding the semiconductor element mount region. The insulative member and the frame preferably each have a thermal expansion coefficient of not more than $10 \times 10^{-6}/° C.$, and a difference in thermal expansion coefficient between the frame and the insulative member is preferably not more than $3 \times 10^{-6}/° C$. In the inventive semiconductor element mount, not less than 80% of the area of the semiconductor element mount region surrounded by the frame on the main surface of the insulative member is covered with a metal layer at least including the semiconductor element mounting electrode layer.

An imaging device according to the present invention comprises the inventive semiconductor element mount, an imaging element as a semiconductor element mounted in the region surrounded by the frame on the main surface of the insulative member of the semiconductor element mount, and a cover of a transparent plate bonded to an upper surface of the frame for sealing an inside of the frame. A semiconductor device according to the present invention comprises the inventive semiconductor element mount, and a semiconductor element mounted on the main surface of the insulative member of the semiconductor element mount and sealed with a sealant.

A semiconductor device according to the present invention is produced by mounting semiconductor elements in the regions defined as the insulative members on a main surface of a collective substrate which includes electrode layers and electrically conductive layers with through-holes of the collective substrate being closed thicknesswise of the collective substrate by filling minimum size hole portions of the through-holes with an electrically conductive material for the electrically conductive layers, then sealing the entire main surface of the collective substrate mounted with the semiconductor elements with a sealant, and cutting the collective substrate together with the sealant into the individual regions wherein an insulative member cut out of the collective substrate has a through-hole at least partly exposed to a side face of the insulative member which intersects a main surface and an external connection surface of the insulative member.

A light emitting diode component according to the present invention comprises the inventive semiconductor device, wherein the semiconductor element is a light emitting element and the sealant is at least one of a fluorescent material and a protective resin. In the inventive light emitting diode component, at least an outermost surface portion of the electrode layer on the main surface of the insulative member is preferably composed of Ag, Al or an Al alloy. A light emitting diode according to the present invention comprises a package having a recess, the inventive light emitting diode component which is mounted on a bottom surface of the recess of the package, and a sealing cap or a lens composed of a material pervious to light emitted from the light emitting diode component and fitted in an opening of the recess for sealing the recess.

Effects of the Invention

In the inventive collective substrate, the interior surface of the through-hole is tapered as having an opening size progressively decreasing from the opening in the main surface of the insulative member and the opening in the external connection surface toward the single minimum size hole portion of the through-hole located at the position thicknesswise of the insulative member, so that the main surface and the external connection surface each meet the interior surface of the through-hole at an obtuse angle. Therefore, when the formation of the electrode layers and the electrically conductive layers of the inventive collective substrate is achieved by physical vapor deposition, printing, plating or the like, separation and uneven thickness of the layers metallized on edges are significantly suppressed. Therefore, the electrode layers can be assuredly connected to the electrically conductive layers without a connection failure, whereby the reliability of the semiconductor device can be improved as compared with the prior art.

Where the heat conductivity of the inventive collective substrate is not less than 10 W/mK, the semiconductor element mount has a higher heat dissipating capability for higher output of the semiconductor element. Where the thermal expansion coefficient of the collective substrate is not more than $10 \times 10^{-6}/^\circ$ C., breakage of the element and the connection failure or disconnection of the electrode layers can be assuredly prevented which may otherwise occur due to an excessive stress exerted on the semiconductor element when the semiconductor element experiences expansion and contraction caused by thermal history in the driving of the element.

Where the inventive collective substrate is produced by firing the precursor sheet (e.g., a ceramic green sheet) and then forming the through-holes in the resulting substrate, uneven displacement of the through-holes caused by uneven shrinkage of the precursor sheet can be prevented. Hence, there is no need to provide greater spaces between the respective regions defined as the insulative members in consideration of the displacement due to the shrinkage. Therefore, the number of the regions to be defined on the single collective substrate can be increased, thereby minimizing a material loss.

Where the electrode layers are formed on the main surfaces and the external connection surfaces of the respective insulative members of the inventive collective substrate and the electrically conductive layers are formed on the interior surfaces of the through-holes, the electrode layers are assuredly connected to the electrically conductive layers without a connection failure. Therefore, with the use of the inventive semiconductor element mount produced by cutting the inventive collective substrate into the individual regions, the semiconductor element mounted on the main surface can be assuredly connected to the second component via the electrode layers and the electrically conductive layer without a connection failure. Where at least the outermost surface portion of the electrode layer on the external connection surface of the inventive semiconductor element mount is composed of Au, the electrode layer can be more assuredly electrically connected to an electrode layer of the second component by any of various known connection methods such as solder bonding and wire bonding.

Where the semiconductor element mount region is defined on the main surface of the insulative member of the inventive semiconductor element mount and the frame is provided on the main surface of the insulative member as surrounding the region, the mounted semiconductor element can be sealed by bonding the cover on the frame after the mounting of the semiconductor element on the region. Particularly, where the semiconductor element is the imaging element and the cover is composed of the transparent material, the imaging element can be sealed in such a state that the imaging element is exposed to light incident through the cover.

Where the insulative member and the frame of the inventive semiconductor element mount each have a thermal expansion coefficient of not more than $10 \times 10^{-6}/^\circ$ C. and a difference in thermal expansion coefficient therebetween is not more than $3 \times 10^{-6}/^\circ$ C., warp of a juncture between the frame and the insulative member and a connection failure due to thermal history can be prevented by approximating the thermal expansion coefficient of the frame to the thermal expansion coefficient of the insulative member.

Not less than 80% of the area of the semiconductor element mount region surrounded by the frame on the main surface of the insulative member of the inventive semiconductor element mount is covered with the metal layer at least including the semiconductor element mounting electrode layer. Where the semiconductor element is the imaging element, the metal layer functions as a light blocking layer for blocking light incident from the rear side of the imaging element through the insulative member to improve the sensitivity of the imaging element. Where the semiconductor element is the light emitting element, the metal layer functions as a reflection layer to improve the light emitting efficiency of the light emitting diode.

Since the inventive imaging device is produced by mounting the imaging element as the semiconductor element in the region surrounded by the frame on the main surface of the insulative member of the semiconductor element mount and bonding the cover of the transparent plate on the frame, the imaging element is sealed in such a state that the imaging element can be exposed to light incident through the cover.

The inventive semiconductor device has a construction such that the semiconductor element is mounted on the main surface of the semiconductor element mount produced by cutting the collective substrate into the individual regions and sealed with the sealant. Therefore, the semiconductor device can be handled in the same manner as a conventional semiconductor element chip when the semiconductor device is mounted on a mount portion of the second component (e.g., a wiring board). Further, the semiconductor device can be checked for defects before the semiconductor device is mounted on the mount portion. In addition, the semiconductor element is not directly touched in the mounting process, so that breakage of the element due to static electricity can be suppressed as much as possible.

Where the inventive semiconductor device is produced by mounting the semiconductor elements on the main surface of the collective substrate with the through-holes being closed thicknesswise of the collective substrate by filling the minimum size hole portions of the through-holes with the electrically conductive material, sealing the semiconductor elements with the sealant and cutting the collective substrate together with the sealant into the individual regions, the sealant is prevented from leaking to the opposite side through the through-holes during the sealing of the semiconductor elements. Therefore, the entire surface of the collective substrate mounted with the semiconductor elements can be protected by the sealant without the need for sealing only specific regions on the surface of the collective substrate. Thus, further size reduction of the semiconductor device can be achieved.

Where at least a part of the through-hole of the insulative member cut out of the collective substrate is exposed to the side face of the insulative member, an exposed portion of the electrically conductive layer formed on the interior surface of the through-hole functions as a solder fillet formation portion. Therefore, when the semiconductor device is mounted on the mount portion of the second component by soldering, the resulting solder fillet reinforces the external connection electrode layer to improve the mounting reliability.

Since the inventive light emitting diode component employs the light emitting element as the semiconductor element and at least one of the fluorescent material and the protective resin is used as the sealant in the inventive semiconductor device, the light emitting diode component can be handled in the same manner as the conventional light emitting element chip when the light emitting diode component is mounted on a mount portion of a package for the light emitting diode or on a mount portion of a board for a surface light emitting device including a multiplicity of light emitting elements arranged in a plane. Further, the light emitting element can be checked for defects and color of emitted light before the light emitting diode component is mounted on the mount portion. In addition, the light emitting element is not directly touched in the mounting process, so that breakage of the element due to static electricity can be suppressed as much as possible.

Where at least the outermost surface portion of the electrode layer on the main surface of the insulative member of the inventive light emitting diode component is composed of Ag, Al or an Al alloy, light emitted from the light emitting element, particularly, light having a wavelength of not longer than 600 nm suitable for emitting white light with the use of a fluorescent material in combination, can be most effectively reflected ahead of the light emitting diode component for improvement of the light emitting efficiency. The inventive light emitting diode employs the inventive light emitting diode component and, therefore, can be efficiently produced without wasting expensive light emitting diode package and the like.

EMBODIMENTS OF THE INVENTION

Figure 1:
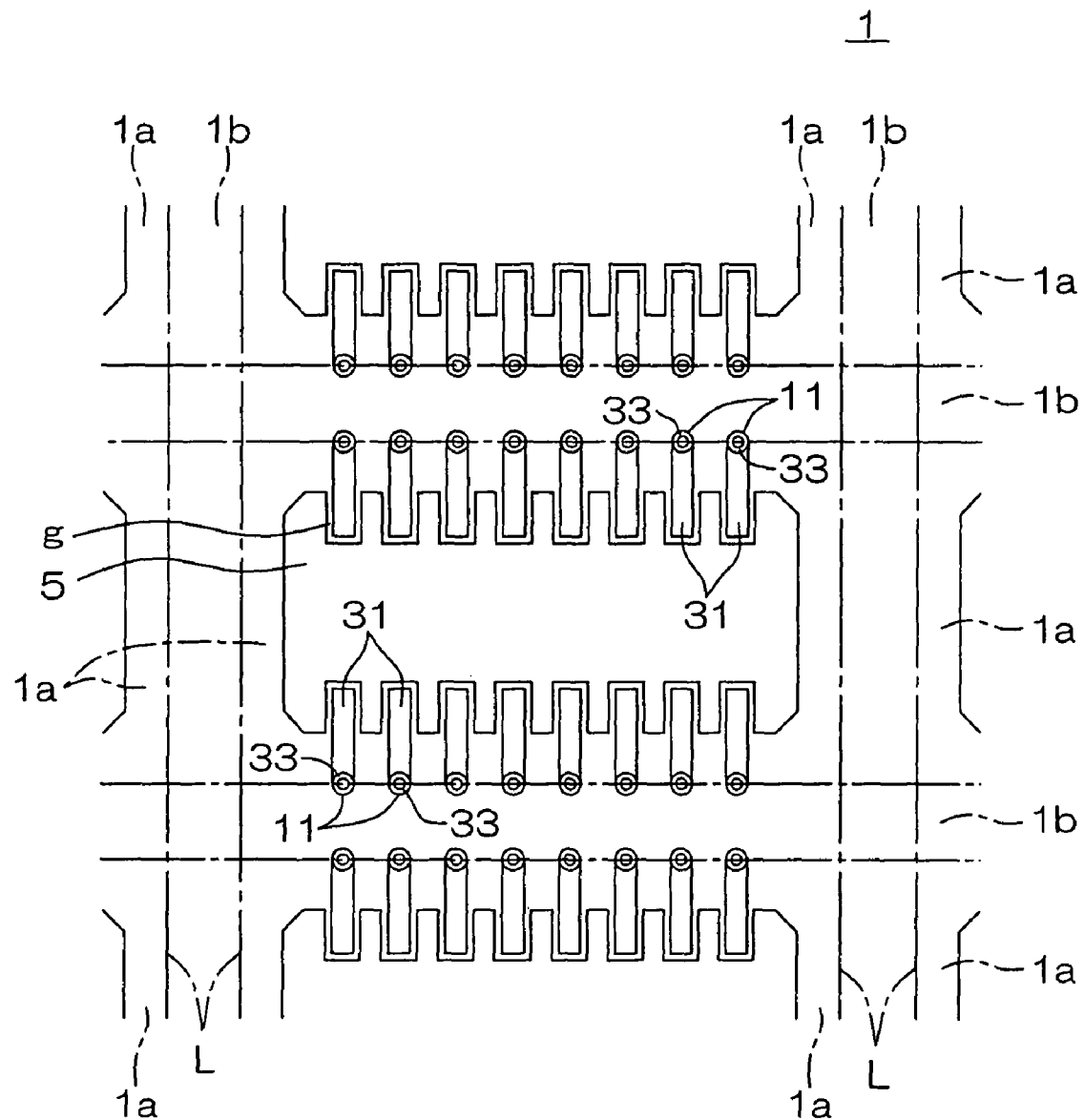
FIG. 1 is an enlarged plan view illustrating a part of a collective substrate to be used for preparation of an insulative member for mounting an imaging element, as an exemplary collective substrate according to one embodiment of the present invention.
Figure 2:
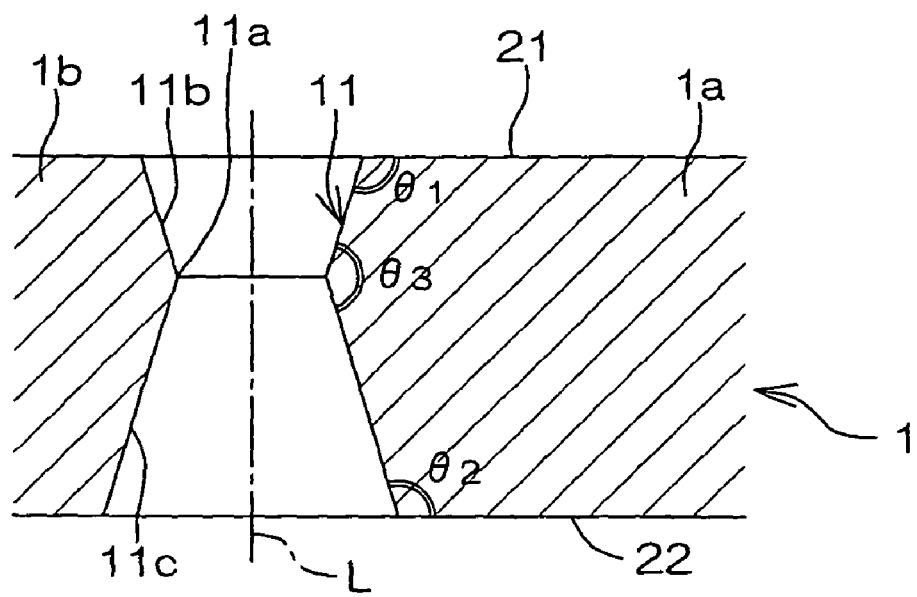
FIG. 2 is an enlarged sectional view of a through-hole of the collective substrate.
Figure 3:
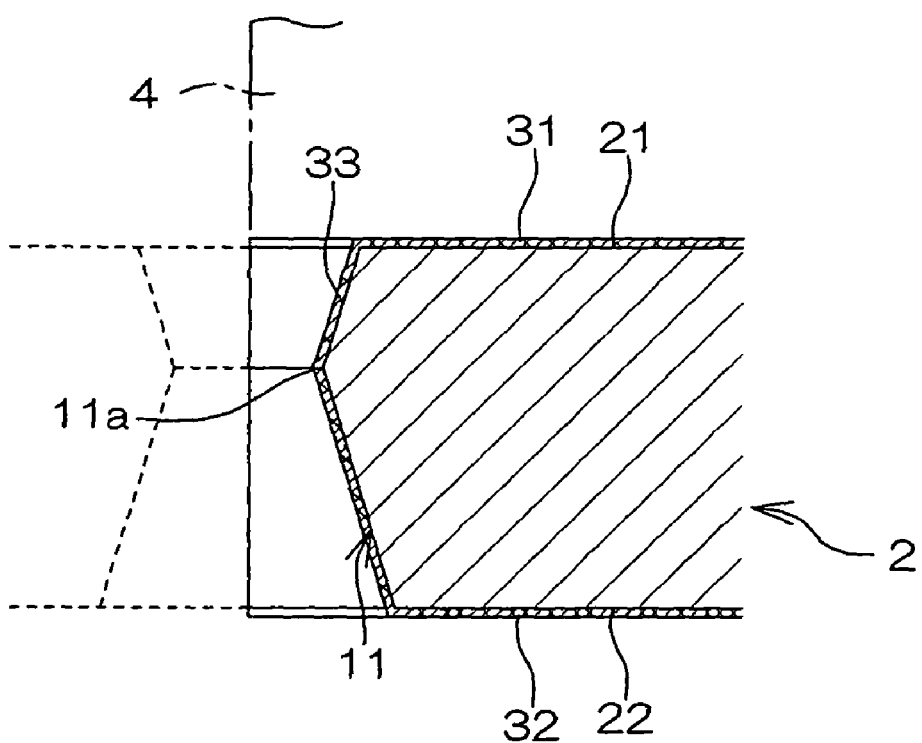
FIG. 3 is an enlarged sectional view of a through-hole of an insulative member cut out of the collective substrate.
Figure 4:
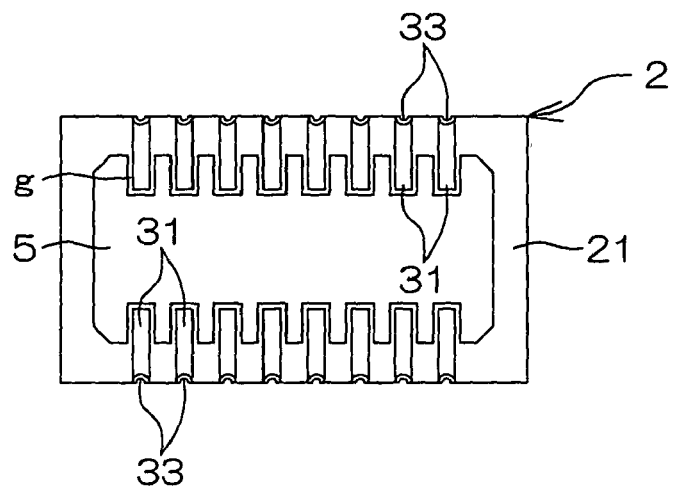
FIG. 4 is a plan view illustrating a main surface of the insulative member.
Figure 5:
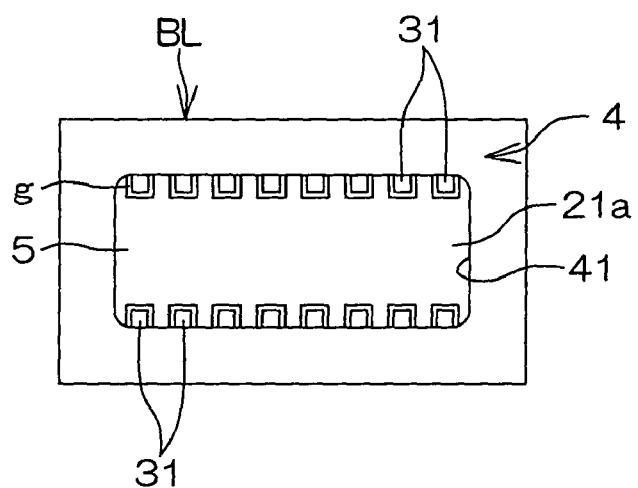
FIG. 5 is a plan view illustrating a semiconductor element mount produced by bonding a frame on the main surface.
Figure 6:
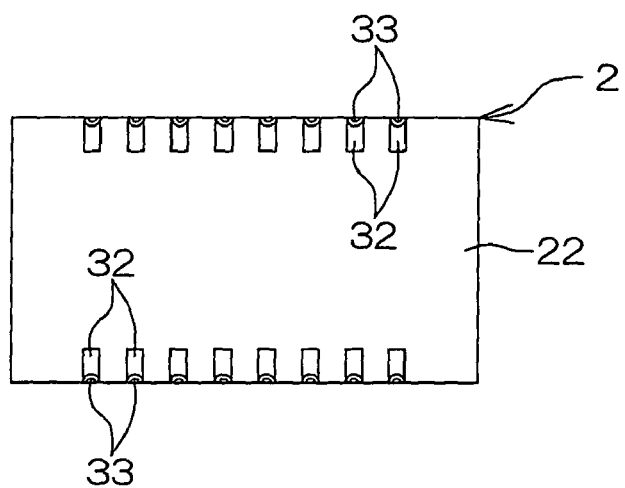
FIG. 6 is a bottom view illustrating an external connection surface of the insulative member.
Figure 7:
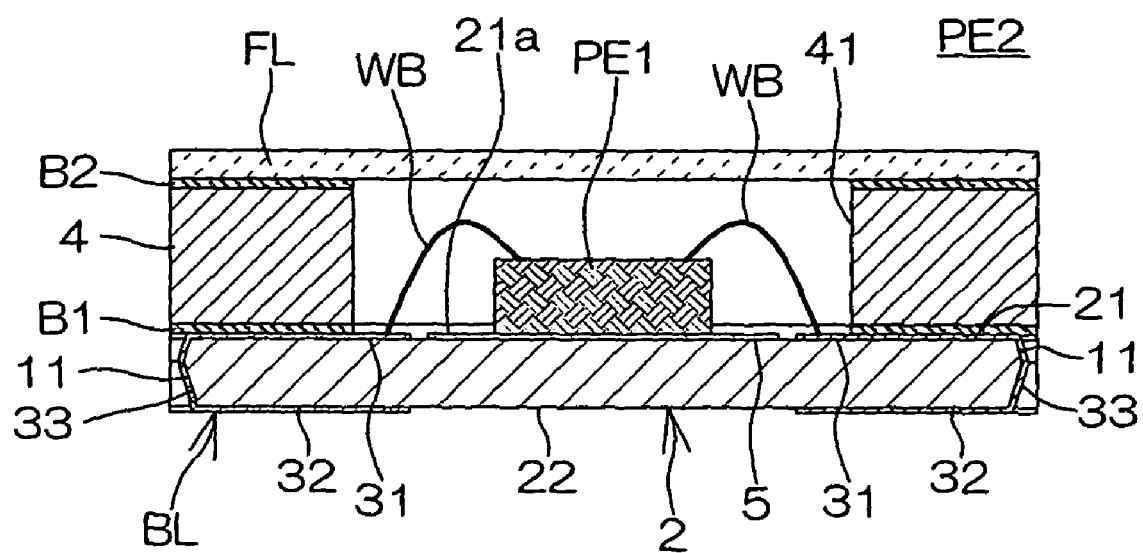
FIG. 7 is a sectional view of an imaging device produced by mounting an imaging element as a semiconductor element in an element mount region on the main surface of the insulative member of the semiconductor element mount and bonding a transparent cover onto the frame.

FIG. 1 is an enlarged plan view illustrating a part of a collective substrate 1 to be used for preparation of an insulative member 2 for mounting an imaging element, as an exemplary collective substrate according to one embodiment of the present invention. FIG. 2 is an enlarged sectional view of a through-hole 11 of the collective substrate 1. FIG. 3 is an enlarged sectional view of a through-hole 11 of an insulative member 2 cut out of the collective substrate 1. FIG. 4 is a plan view illustrating a main surface 21 of the insulative member 2. FIG. 5 is a plan view illustrating a semiconductor element mount BL produced by bonding a frame 4 on the main surface 21. FIG. 6 is a bottom view illustrating an external connection surface 22 of the insulative member 2. FIG. 7 is a sectional view of an imaging device PE2 produced by mounting an imaging element PE1 as a semiconductor element in an element mount region 21a on the main surface 21 of the insulative member 2 of the semiconductor element mount BL and bonding a transparent cover FL onto the frame 4.

Referring to FIG. 1, the collective substrate 1 of this embodiment is entirely formed of a ceramic material as having a plate shape, and includes a plurality of regions 1a of a predetermined plane shape (a rectangular shape in this figure) in which insulative members 2 are defined, and a region 1b having a constant width and provided between the respective regions 1a in a matrix shape to be later removed by dicing for defining the plurality of regions 1a. In this figure, one-dot-and-dash lines indicate boundaries L between the regions 1a and the region 1b. A plurality of through-holes 11 (eight through-holes 11 in this figure) are provided respectively in the collective substrate 1 as arranged along each of two parallel longitudinal edges of each of the regions 1a across the boundary L.

The collective substrate 1 is preferably produced by firing a ceramic precursor material (a ceramic green sheet or the like) to prepare a planar substrate and then forming the through-holes 11 in the substrate by post processing. Thus, the formation of the through-holes 11 can be achieved at a higher positional accuracy which is not achievable by the conventional co-firing method.

Referring to FIG. 2, the through-holes 11 each have an interior surface including two taper surfaces, i.e., first and second taper surfaces 11b, 11c. The first taper surface 11b has a cone-like taper shape having an opening diameter progressively decreasing from a main surface 21 of the insulative member 2 (on an upper side in this figure) toward a single minimum size hole portion 11a of a round plane shape located at a position thicknesswise of the insulative member 2, and has a round opening in the main surface 21. The second taper surface 11c has a cone-like taper shape having an opening diameter progressively decreasing from an external connection surface 22 of the insulative member 2 (on a lower side in this figure) toward the minimum size hole portion 11a, and has a round opening in the external connection surface 22.

Any of various conceivable post-processing methods may be employed for forming the through-holes 11 each having the illustrated shape in the planar collective substrate 1 prepared by preliminary firing, but it is particularly preferred to employ a sandblast method for the formation of the through-holes. Referring to FIGS. 1 and 2, round regions of the collective substrate 1 corresponding to the openings of the through-holes 11 in the external connection surface 22 are exposed with the other region protected by a resist film, and the exposed regions of the collective substrate 1 are selectively removed in the thicknesswise direction by the sandblast method, whereby the second taper surfaces 11c are formed. Similarly, round regions of the collective substrate 1 corresponding to the openings of the through-holes 11 in the main surface 21 are exposed with the other region protected by a resist film, and the exposed regions of the collective substrate 1 are selectively removed in the thicknesswise direction by the sandblast method, whereby the first taper surfaces 11b are formed.

A feature of the sandblast method is that the size of the resulting hole decreases with the depth of the hole. Therefore, the through-holes 11 are each formed as having the taper surfaces 11b, 11c of a cone-like taper shape and the minimum size hole portion 11a defined by a junction between the taper surfaces 11b and 11c. In this method, the opening diameter of the minimum size hole portion 11a and the position of the minimum size hole portion 11a with respect to the thicknesswise of the insulative member 2 can be arbitrarily controlled by adjusting the sandblasting depth and the sandblasting diameter for the formation of the taper surfaces 11b, 11c.

Because of the through-hole 11 having the aforesaid shape, the main surface 21 continuous to the first taper surface 11b forms an obtuse angle $\theta_1$ therebetween, and the external connection surface 22 continuous to the second taper surface 11c forms an obtuse angle $\theta_2$ therebetween. Therefore, when electrode layers 31, 32 and an electrically conductive layer 33 are formed as shown in FIG. 3, for example, by physical vapor deposition, printing, plating or the like, separation and uneven thickness of the layers metallized on an edge defined by the first taper surface 11b and the main surface 21 and on an edge defined by the second taper surface 11c and the external connection surface 22 are significantly suppressed. Therefore, the electrode layers 31, 32 can be assuredly connected to the electrically conductive layer 33 without a connection failure, whereby the reliability of the resulting imaging device PE2 can be improved.

If the taper surfaces 11b, 11c of the through-hole 11 met at an acute angle, the adhesion of the electrically conductive layer 33 metallized on the minimum size hole portion 11a at an edge defined by the taper surfaces 11b, 11c would be reduced. Therefore, the metallized electrically conductive layer 33 would suffer from disconnection or uneven thickness. In order to ensure that the electrically conductive layer 33 is formed as having an even thickness with portions thereof above and below the minimum size hole portion 11a properly connected to each other, the taper surfaces 11b, 11c preferably meet at an obtuse angle $\theta_3$. To allow the taper surfaces 11b, 11c to meet at the obtuse angle $\theta_3$, conditions for the sandblasting are controlled to adjust the taper angles of the taper surfaces 11b, 11c.

The collective substrate 1 preferably has a heat conductivity of not less than 10 W/mK. If the heat conductivity is not less than 10 W/mK, the resulting semiconductor element mount BL has a higher heat dissipating capability, so that the output of the imaging element PE1 can be increased. The collective substrate 1 preferably has a thermal expansion coefficient of not more than $10 \times 10^{-6}/°$ C. If the thermal expansion coefficient is not more than $10 \times 10^{-6}/°$ C., breakage or disconnection of the imaging element PE1 can be prevented which may otherwise occur due to an excessive stress exerted on the imaging element PE1 when the element experiences expansion and contraction caused by thermal history in the driving of the element.

Exemplary materials for the collective substrate 1 satisfying these conditions include insulative ceramic materials such as AlN, $Al_2O_3$, SiC, $Si_3N_4$, BeO and BN, among which $Al_2O_3$ is preferred in terms of costs. In consideration of the heat dissipating capability, however, the collective substrate 1 preferably has a heat conductivity of not less than 80 W/mK, particularly preferably not less than 150 W/mK within the aforesaid range. To achieve such a high heat conductivity, AlN and SiC are preferred. For reduction of a difference in thermal expansion coefficient to the imaging element PE1, AlN and $Al_2O_3$ are preferred.

Therefore, if top priority is given to the heat dissipating capability and the like, AlN is particularly preferred among the aforesaid ceramic materials for the formation of the collective substrate 1. If the heat dissipating capability is not requisite, the collective substrate 1 is preferably formed of $Al_2O_3$. In consideration of a trade-off between the heat dissipating capability and other properties such as mechanical strength of the collective substrate 1 and production costs, it is particularly preferred that the collective substrate 1 has a heat conductivity of not more than 300 W/mK within the aforesaid range and a thermal expansion coefficient of $4 \times 10^{-6}$ to $7 \times 10^{-6}/°$ C. within the aforesaid range.

The electrode layers 31 for mounting a semiconductor element are provided on the main surface 21 of the collective substrate 1, and the electrode layers 32 for connection to a second component are provided on the external connection surface 22. The electrically conductive layers 33 for connection between the electrode layers 31 and 32 are respectively provided on the interior surfaces of the through-holes 11 (FIGS. 1 to 6).

Among these layers, a plurality of the electrode layers 31 on the main surface 21 are individually provided in association with the respective through-holes 11. In the embodiment shown in the figures, the electrode layers 31 each have a rectangular shape, and respectively extend from the through-holes 11 arranged along each of the two parallel longitudinal edges of the rectangular region 1a defined as the insulative member 2 toward the other longitudinal edge. On the other hand, a plurality of the electrode layers 32 on the external connection surface 22 are also individually provided in association with the respective through-holes 11. The electrode layers 32 each have a rectangular shape, and respectively extend from the through-holes 11 arranged along each of the two parallel longitudinal edges of the rectangular region 1a defined as the insulative member 2 toward the other longitudinal edge. Further, the electrically conductive layers 33 respectively cover the entire interior surfaces of the through-holes 11, and are each connected to the corresponding electrode layer 31 on the main surface 21 and to the corresponding electrode layer 32 on the external connection surface 22.

A metal layer 5 is provided on the main surface 21 with gaps g provided between the metal layer 5 and the respective electrode layers 31 for prevention of contact therebetween. Together with the electrode layers 31, the metal layer 5 functions as a light blocking layer which covers a semiconductor element mount region 21a of the main surface 21 to be surrounded by a frame 4. That is, the metal layer 5 blocks light incident through the insulative member 2 from a back side of the imaging element PE1 mounted on the region 21a to improve the sensitivity of the imaging element PE1.

The electrode layers 31 and the metal layer 5 preferably cover not less than 80% of the area of the region 21a. Thus, the electrode layers 31 and the metal layer 5 sufficiently function as the light blocking layer. However, the electrode layers 31 should be spaced from each other, and the metal layer 5 should be spaced from the electrode layers 31. Therefore, the gaps g are inevitably present between the metal layer 5 and the respective electrode layers 31, making it impossible to cover 100% of the area of the region 21a or the entire region 21a with the electrode layers 31 and the metal layer 5. In order to provide sufficient gaps g between the respective electrode layers 31 and the metal layer 5 for prevention of short circuit between the electrode layers 31, the electrode layers 31 and the metal layer 5 preferably cover not more than 95% of the area of the region 21a. Alternatively, the electrode layers 31 may be formed as having a greater total area to cover 80 to 95% of the area of the region 21a without the provision of the metal layer 5.

The electrode layers 31, 32 and the electrically conductive layers 33 may be formed of any of various known metal materials and the like excellent in electrical conductivity. These layers may have a single layer structure or a multi-layer structure including two or more layers, and formed by any of various metallization methods including a wet plating method and physical vapor deposition methods such as a vacuum vapor deposition method and a sputtering method. The wet plating method provides a metal film having a sufficient thickness by a single treatment step. Therefore, the electrode layers 31, 32 and the electrically conductive layers 33 may be formed as each having a single layer structure, or as having a multi-layer structure, for example, including one or two underlying layers of Cu and/or Ni and a 0.1 to 10-μm thick surface layer of a highly electrically conductive metal such as Ag or Au stacked on the underlying layers.

By the physical vapor deposition method, the electrode layers 31, 32 and the electrically conductive layers 33 are preferably formed as each having a multi-layer structure including a plurality of layers having different functions and stacked one on another. For example, the multi-layer structure may be a three-layer structure including the following layers stacked on the collective substrate 1 in the following order:

(I) an adhesion layer composed of Ti, Cr, NiCr, Ta or a compound of any of these metals and having excellent adhesion to the collective substrate 1;
(II) a diffusion prevention layer composed of Pt, Pd, Cu, Ni, Mo or NiCr and functioning to prevent diffusion of a metal forming the following surface layer; and
(III) a highly electrically conductive surface layer composed of Ag, Al or Au.

The adhesion layer preferably has a thickness of about 0.01 to about 1.0 μm, and the diffusion prevention layer preferably has a thickness of about 0.01 to about 1.5 μm. The surface layer preferably has a thickness of about 0.1 to about 10 μm.

By employing the physical vapor deposition method and the wet plating method in combination, the electrode layers 31, 32 and the electrically conductive layers 33 may be formed as each having a multi-layer structure. The multi-layer structure may be provided, for example, by forming an adhesion layer and a diffusion prevention layer by the physical vapor deposition method, forming an underlying layer of Cu or Ni by the wet plating method, and forming a highly electrically conductive surface layer of Ag, Al or Au by the physical vapor deposition method or the wet plating method.

Bonding pads of Au or the like may be provided on surfaces of the electrode layers 31 on the main surface 21, for example, for improving the reliability of connection between terminals of the mounted imaging element PE1 and the electrode layers 31 through bonding wires WB. Further, solder bonding layers of Au or the like may be provided on surfaces of the electrode layers 32 on the external connection surface 22, for example, for improving the reliability of surface mounting with solder connection between the electrode layers 32 and electrode layers provided on a board for use in a digital camera or the like.

However, where Au is used as an electrically conductive material for the formation of the electrode layers 31, 32 of the single layer structure or for the formation of the outermost layers of the electrode layers 31, 32 of the multi-layer structure, the provision of the bonding pads and the solder bonding layers may be obviated. Since the metal layer 5 and the electrode layers 31 are formed on the same surface, the metal layer 5 and the electrode layers 31 may be simultaneously formed as having the same layer structure. However, the metal layer 5 is merely required to function as the light blocking layer. Therefore, even if the electrode layers 31 are formed as having the multi-layer structure as described above, the metal layer 5 may be formed as having a single layer structure including a sufficiently thick layer.

Pattern formation of the electrode layers 31, 32 and the metal layers 5 on the collective substrate 1 may be achieved, for example, by forming a metal mask or a photolithographic mask and selectively metallizing exposed surface portions of the collective substrate 1 uncovered with the mask by the wet plating method or the physical vapor deposition. For the formation of the electrode layers 31, 32 of the multi-layer structure, the exposed surface portions of the collective substrate 1 are repeatedly metallized by employing different metals. When the electrode layers 31 and the metal layers 5 are formed on the main surface 21 and/or when the electrode layers 32 are formed on the external connection surface 22, the formation of the electrically conductive layers 33 is achieved simultaneously with the formation of the electrode layers 31 and/or the formation of the electrode layers 32 so as to connect the electrically conductive layers 33 to the electrode layers 31 and/or the electrode layers 32 by uncovering the openings of the through-holes 11 with the mask.

For production of a semiconductor element mount BL for mounting an imaging element PE1 as a semiconductor element by employing the collective substrate 1 formed with the electrode layers 31, 32, the electrically conductive layers 33 and the metal layers 5, the region 1b of the collective substrate 1 defined by the boundaries L is removed by dicing or the like. Thus, the remaining regions 1a are separated from each other, thereby providing a plurality of insulative members 2. Thereafter, a frame 4 is bonded onto the main surface 21 of each of the resulting insulative members 2, for example, via a bonding layer B1 of a resin or a low melting point glass. Thus, the semiconductor element mount BL is produced in which a region 21a of the main surface 21 exposed through a hole 41 of the frame 4 serves as an element mount portion for mounting the imaging element PE1 as the semiconductor element (FIGS. 4 to 7).

Further, a plurality of semiconductor element mounts BL each including a frame 4 stacked on an insulative member 2 may be produced by preparing a frame formation collective substrate having a plurality of holes 41 arranged according to a pitch of the regions, 1a of the collective substrate 1 and having a frame defining region in which a plurality of frames 4 are defined, bonding the frame formation collective substrate on the main surface 21 of the collective substrate 1 formed with the electrode layers 31, 32, the electrically conductive layers 33 and the metal layers 5 via a bonding layer B1, and removing the region 1b of the collective substrate 1 together with a portion of the frame formation collective substrate overlapping with the region 1b by dicing or the like.

For prevention of warp or deformation of the frame 4 stacked on the insulative member 2 and for reduction of a difference in thermal expansion coefficient between the frame 4 and the semiconductor element, the frame 4 is preferably composed of a material which has a thermal expansion coefficient of not more than $10 \times 10^{-6}/°C.$, particularly $4 \times 10^{-6}$ to $7 \times 10^{-6}/°C.$ and differs in thermal expansion coefficient from the insulative member 2 by not more than $3 \times 10^{-6}/°C.$, particularly not more than $1 \times 10^{-6}/°C.$ More preferably, the difference in thermal expansion coefficient is eliminated by employing the same material as the insulative member 2 for the formation of the frame 4. Where the insulative member 2 is composed of AlN, for example, the frame 4 is preferably also composed of AlN. Where the insulative member 2 is composed of $Al_2O_3$, the frame 4 is preferably also composed of $Al_2O_3$. Where the semiconductor element is an imaging element, the frame 4 is preferably composed of a material having a light blocking property for blocking unwanted light incident through the frame 4.

Referring to FIG. 7, an imaging device PE2 according to the present invention is produced by mounting an imaging element PE1 on the region 21a of the semiconductor element mount BL, connecting distal end portions of the electrode layers 31 exposed within the region 21a to terminals (not shown) of the imaging element PE1 via bonding wires WB, and bonding a cover FL of a transparent material to the frame 4 via a bonding layer B2 of a resin, a low melting point glass or the like. In the imaging device PE2, the imaging element PE1 is sealed in such a state that the imaging element PE1 can be exposed to light incident through the cover FL. The respective terminals of the imaging element PE1 are connected to electrode layers and the like provided on a board for a digital camera through the bonding wires WB, the electrode layers 31, the electrically conductive layers 33 and the electrode layers 32.

Figure 8:
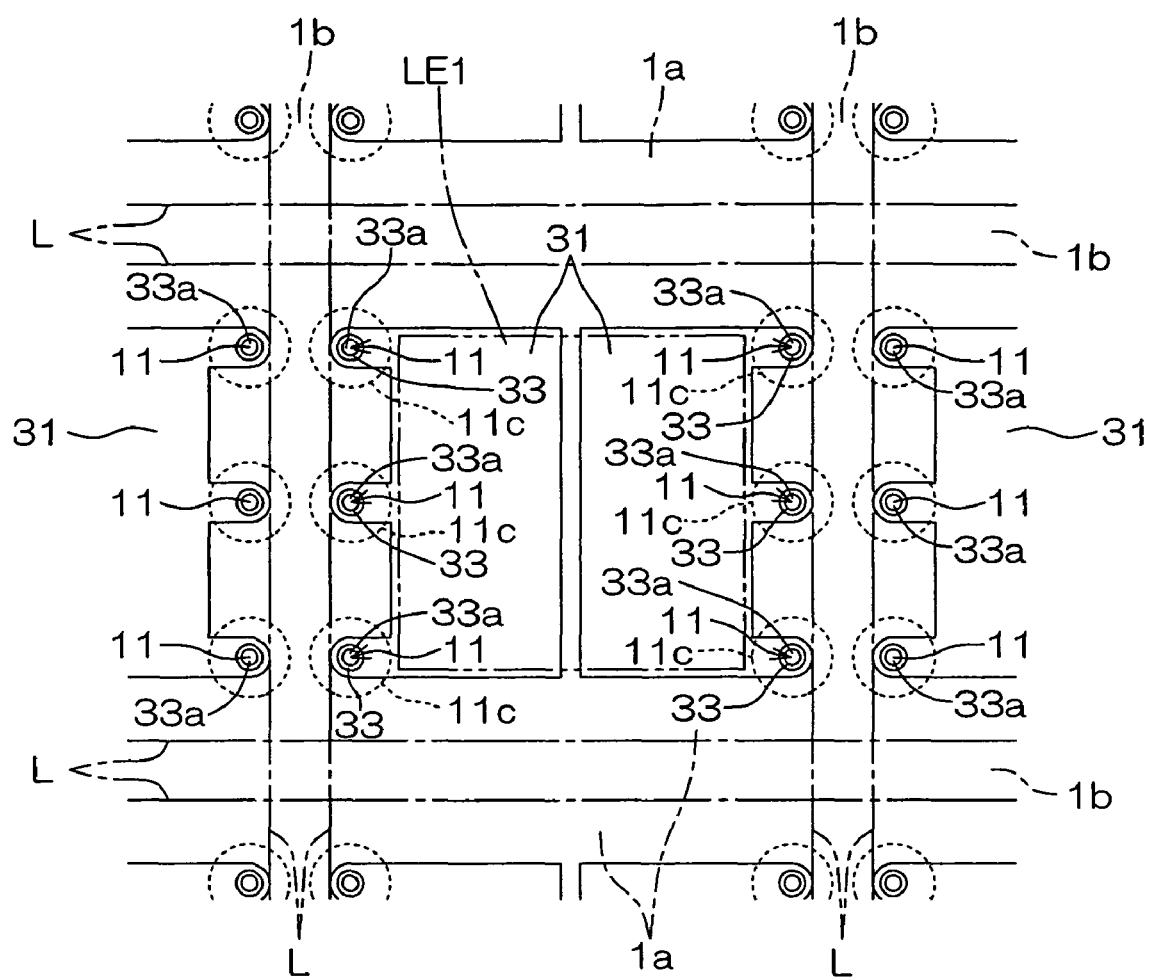
FIG. 8 is an enlarged plan view illustrating a part of a collective substrate to be used for preparation of an insulative member for mounting a light emitting element, as an exemplary collective substrate according to another embodiment of the present invention.
Figure 9:
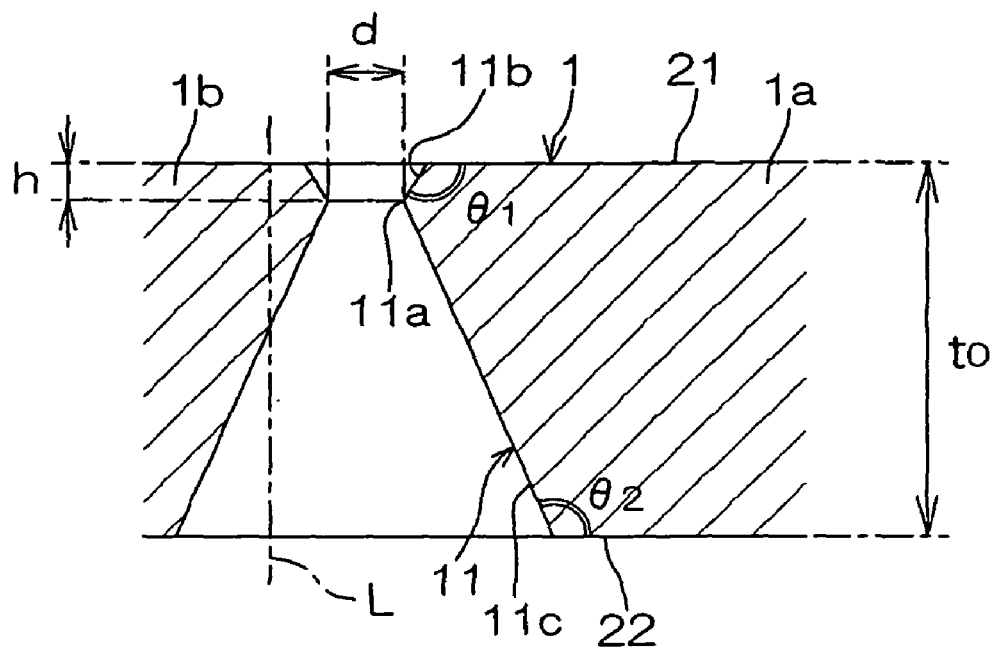
FIG. 9 is an enlarged sectional view of a through-hole of the collective substrate.
Figure 10:
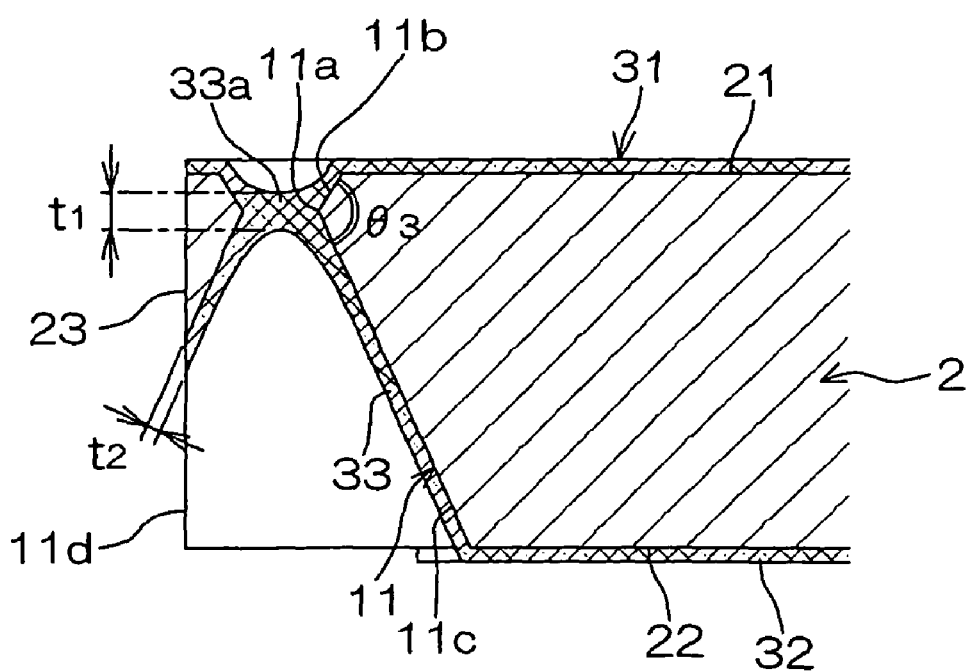
FIG. 10 is an enlarged sectional view of a through-hole of an insulative member cut out of the collective substrate.
Figure 11:
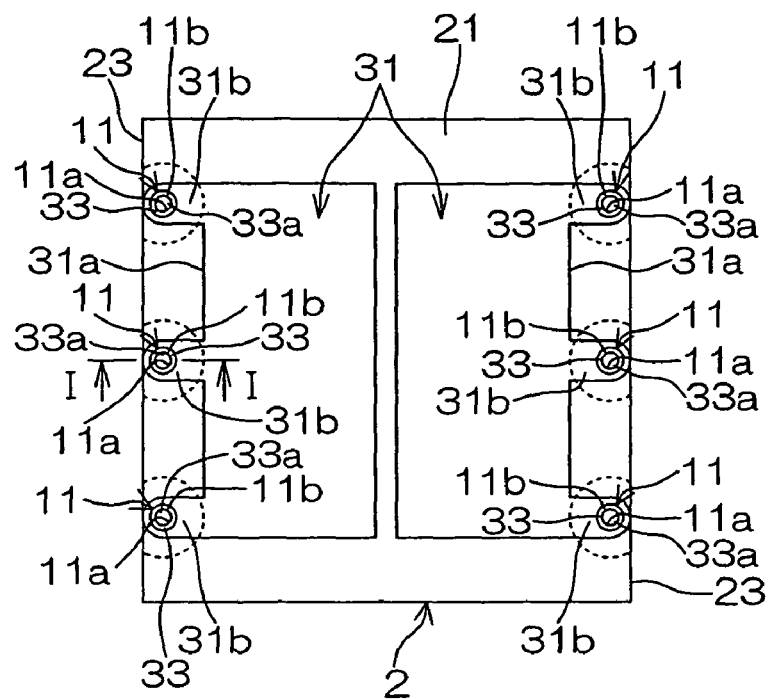
FIG. 11 is a plan view illustrating a main surface of the insulative member.
Figure 12:
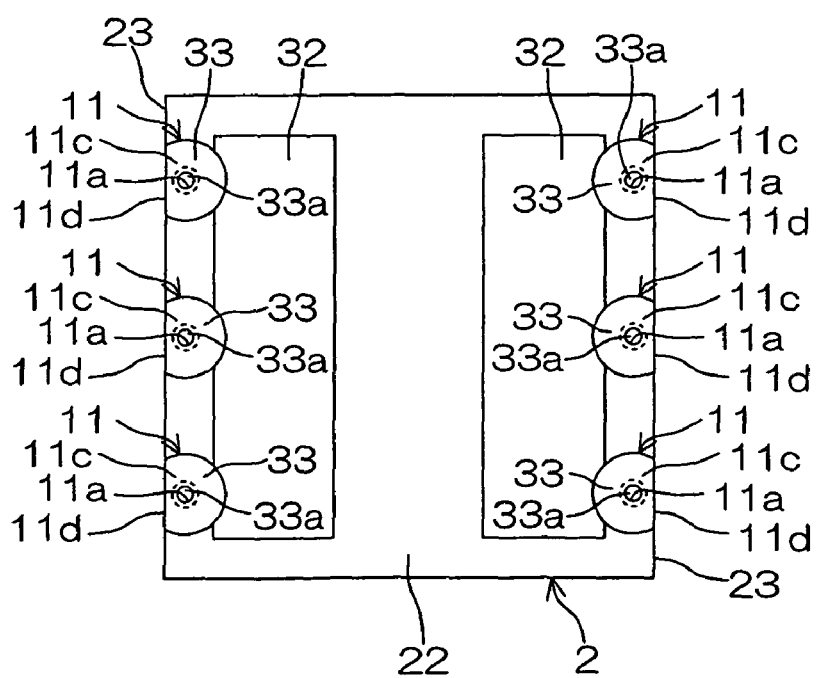
FIG. 12 is a bottom view illustrating an external connection surface of the insulative member.
Figure 13:
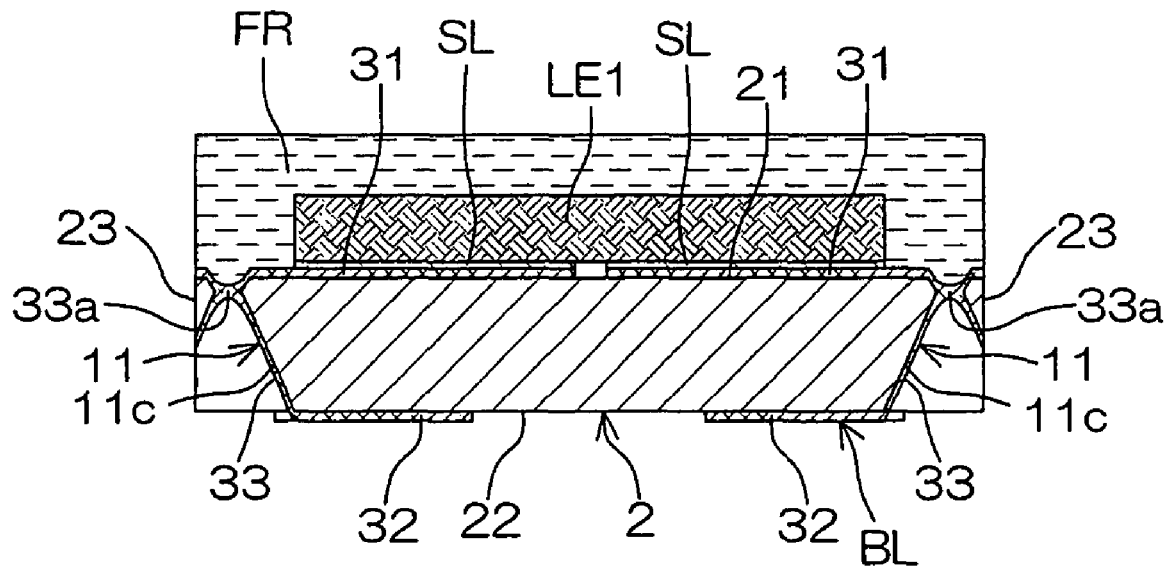
FIG. 13 is a sectional view illustrating a light emitting diode component produced by mounting a light emitting element as a semiconductor element on a main surface of an insulative member of a semiconductor element mount and sealing the light emitting element by a fluorescent material and/or a protective resin as a sealant.
Figure 14:
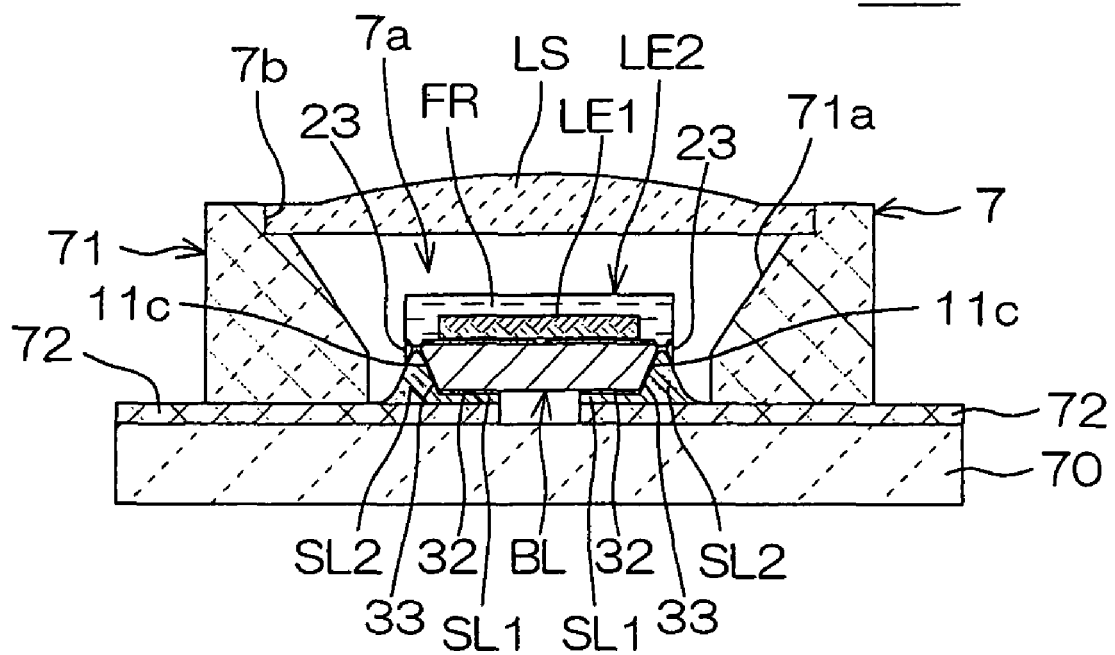
FIG. 14 is a sectional view illustrating a light emitting diode produced by mounting the light emitting diode component in a package.

FIG. 8 is an enlarged plan view illustrating a part of a collective substrate 1 to be used for preparation of an insulative member 2 for mounting a light emitting element, as an exemplary collective substrate 1 according to another embodiment of the present invention. FIG. 9 is an enlarged sectional view of a through-hole 11 of the collective substrate 1. FIG. 10 is an enlarged sectional view of a through-hole 11 of an insulative member 2 cut out of the collective substrate 1. FIG. 11 is a plan view illustrating a main surface 21 of the insulative member 2. FIG. 12 is a bottom view illustrating an external connection surface 22 of the insulative member 2. FIG. 13 is a sectional view illustrating a light emitting diode component LE2 produced by mounting a light emitting element LE1 as a semiconductor element on a main surface 21 of an insulative member 2 of a semiconductor element mount BL and sealing the light emitting element LE1 by a fluorescent material and/or a protective resin FR as a sealant. FIG. 14 is a sectional view illustrating a light emitting diode LE3 produced by mounting the light emitting diode component LE2 in a package 7.

Referring to FIG. 8, the collective substrate 1 of this embodiment is also entirely formed of a ceramic material as having a plate shape, and includes a plurality of regions 1a of a predetermined plane shape (a rectangular shape in this figure) defined as insulative members 2, and a region 1b having a constant width and provided between the respective regions 1a in a matrix shape to be later removed by dicing for defining the plurality of regions 1a. In this figure, one-dot-and-dash lines indicate boundaries L between the regions 1a and the region 1b. A plurality of through-holes 11 (three through-holes 11 in this figure) are formed in the collective substrate 1 as arranged along each of two parallel longitudinal edges of each of the regions 1a in the vicinity of the boundary L. As clearly illustrated in FIGS. 8-10, the through-holes 11 are formed such that the boundary L in a top view, falls between the boundaries of the openings of the through-holes on the main surface and on the external connection surface, so that, when the collective substrate is cut, the through-hole 11 is closed by the insulative member 2 on the main surface side end of the side surface thereof.

The collective substrate 1 is preferably produced by firing a ceramic precursor material (a ceramic green sheet or the like) to prepare a planar substrate and then forming the through-holes 11 in the substrate by post processing as in the preceding embodiment. Thus, the formation of the through-holes 11 can be achieved at a high positional accuracy which is not achievable by the conventional co-firing method. Further, electrode layers 31, 32 and electrically conductive layers 33 are preferably formed on surfaces of the collective substrate 1 after the firing. In this case, the electrode layers 31 and the like may be formed of Al having excellent light reflectivity, although it is difficult to form Al layers by plating on underlying layers formed of Mo, W or the like by the co-firing method.

Referring to FIG. 9, the through-holes 11 each have an interior surface including two taper surfaces, i.e., first and second taper surfaces 11b, 11c. The first taper surface 11b has a cone-like taper shape having an opening diameter progressively decreasing from the main surface 21 of the insulative member 2 (on an upper side in this figure) toward a single minimum size hole portion 11a of a round plane shape located at a position thicknesswise of the insulative member 2, and has a round opening in the main surface 21. The second taper surface 11c has a cone-like taper shape having an opening diameter progressively decreasing from the external connection surface 22 of the insulative member 2 (on a lower side in this figure) toward the minimum size hole portion 11a, and has a round opening in the external connection surface 22.

The main surface 21 continuous to the first taper surface 11b forms an obtuse angle $\theta_1$ therebetween, and the external connection surface 22 continuous to the second taper surface 11c forms an obtuse angle $\theta_2$ therebetween. Therefore, when the electrode layers 31, 32 and the electrically conductive layer 33 are formed, for example, by physical vapor deposition, printing, plating or the like, separation and uneven thickness of the layers metallized on an edge defined by the second taper surface 11b and the main surface 21 and on an edge defined by the first taper surface 11c and the external connection surface 22 are significantly suppressed. Therefore, the electrode layers 31, 32 can be assuredly connected to the electrically conductive layer 33 without a connection failure, whereby the reliability of the resulting light emitting diode component LE2 and the resulting light emitting diode LE3 can be improved.

Referring to FIG. 10, when the electrically conductive layers 33 are formed on the interior surfaces of the through-holes 11, the minimum size hole portions 11a are filled to be closed thicknesswise of the collective substrate 1 by deposition of an electrically conductive material 33a for the electrically conductive layers 33 before the collective substrate is cut. When light emitting elements LE1 are mounted on the main surfaces 21 of the respective insulative members 2 of the collective substrate 1 and sealed with a fluorescent material and/or a protective resin FR as a sealant in the subsequent step as described above, the fluorescent material and/or the protective resin FR are prevented from leaking to the rear surface of the collective substrate 1 through the through-holes 11.

However, if the separation or uneven thickness of the electrically conductive layers 33 each metallized on the minimum size hole portion 11a on the edge defined by the taper surfaces 11b, 11c of the through-hole 11 occurs, it will be impossible to properly fill the minimum size hole portion 11a with the electrically conductive material 33a. In order to properly fill the minimum size hole portion 11a with the electrically conductive material 33a, the taper surfaces 11b, 11c preferably meet at an obtuse angle $\theta_3$. To allow the taper surfaces 11b, 11c to form the obtuse angle $\theta_3$, conditions for sandblasting and the like are controlled to adjust the taper angles of the taper surfaces 11b, 11c.

Referring to FIGS. 8 and 9, the second taper surface 11c of the through-hole 11 is located across the boundary L between the region 1a defined as the insulative member 2 and the region 1b defined between the regions 1a in the collective substrate 1. When the region 1b is removed by dicing or the like to separate the regions 1a from each other, portions of the electrically conductive layers 33 formed on the interior surfaces of the second taper surfaces 11c are exposed to side faces 23 of the insulative member 2 of the semiconductor element mount BL through openings 11d as shown in FIGS. 10 to 12. Therefore, the exposed portions of the electrically conductive layers 33 function as solder fillet formation portions. When a light emitting diode component LE2 is mounted on a second component, e.g., in a package 7 for a light emitting diode LE3 as shown in FIG. 14 by soldering, the resulting solder fillets reinforce the external connection electrode layers 32 to improve the mounting reliability.

The sandblast method described above is preferably employed for forming the through-holes 11 each having the aforesaid shape in the planar collective substrate prepared by preliminary firing by the post processing. In this method, the opening diameter of the minimum size hole portion 11a and the position of the minimum size hole portion 11a with respect to the thicknesswise of the insulative member 2 can be arbitrarily controlled by adjusting the sandblasting depth and the sandblasting diameter for the formation of the taper surfaces 11b, 11c.

Referring to FIG. 9, the position of the minimum size hole portion 11a with respect to the thicknesswise of the insulative member 2 to be controlled in the aforesaid manner is preferably such that a distance h between the main surface 21 and the minimum size hole portion 11a is more than zero and not more than 2/3 of the thickness $t_0$ of the insulative member 2. Thus, the taper surfaces 11b, 11c are provided above and below the minimum size hole portion 11a. Further, the first taper surface 11b meets the main surface 21 at the obtuse angle $\theta_1$, and the second taper surface 11c meets the external connection surface 22 at the obtuse angle $\theta_2$. Therefore, the electrode layers 31, 32 respectively formed on the main surface 21 and the external connection surface 22 can be assuredly connected to the electrically conductive layer 33.

The portion of the electrically conductive layer 33 formed on the second taper surface 11c as continuously extending from the electrode layer 32 on the external connection surface 22 outside the minimum size hole portion 11a may be allowed to have a sufficient exposed area, thereby satisfactorily functioning as the solder fillet formation portion. Further, the first and second taper surfaces 11b, 11c are formed from the opposite sides of the collective substrate 1 by the sandblast method so as to be connected to each other, whereby the through-holes 11 can be assuredly formed without deformation. To allow the portion of the electrically conductive layer 33 on the second taper surface 11c to have a sufficient exposed area functioning as the solder fillet formation portion, the distance h is more preferably not more than 1/2 of the thickness $t_0$ of the insulative member 2. In order to assuredly form the through-holes 11 by the aforesaid method, the distance h is further preferably about 5 μm to about 50 μm.

Referring to FIG. 9, the minimum size hole portion 11a preferably has an opening diameter d of not less than 10 μm. The minimum size hole portions 11a each having an opening diameter d of not less than 10 μm can be relatively accurately formed during the formation of the through-holes 11 by an ordinary processing method such as the sandblast method. Further, the minimum size hole portions 11a of the respective through-holes 11 can be formed as having the same opening diameter d without a need for another processing step. This improves the productivity of the semiconductor element mount BL, thereby reducing the costs.

The opening diameter d of the minimum size hole portion 11a is preferably not more than 200 μm. If the opening diameter d is not more than 200 μm, the minimum size hole portions 11a can be more efficiently filled with the electrically conductive material 33a during the formation of the electrically conductive layers 33 on the interior surfaces of the through-holes 11. Therefore, the leak of the fluorescent material and/or the protective resin FR can be more assuredly prevented.

In order to further assuredly form the minimum size hole portions 11a of the through-holes 11 by an ordinary method such as the sandblast method and to further efficiently fill the minimum size hole portions 11a with the electrically conductive material 33a during the formation of the electrically conductive layers 33 on the interior surfaces of the through-holes 11, the minimum size hole portions 11a preferably each have an opening diameter d of 50 to 150 μm, more preferably 75 to 125 μm.

In order to increase the heat dissipating capability of the semiconductor element mount BL for higher output of the light emitting element LE1, the collective substrate 1 preferably has a heat conductivity of not less than 10 W/mK, more preferably not less than 80 W/mK, particularly preferably not less than 150 W/mK. In consideration of a trade-off between the heat conductivity and other properties such as mechanical strength and production costs, the heat conductivity of the collective substrate 1 is preferably not more than 300 W/mK.

In order to prevent breakage and disconnection of the light emitting element LE1 which may occur due to an excessive stress exerted on the element LE1 when the element experiences expansion and contraction caused by thermal history in the driving of the element, the collective substrate 1 preferably has a thermal expansion coefficient of not more than $10 \times 10^{-6}/°$ C. In consideration of a trade-off between the thermal expansion coefficient and other properties such as mechanical strength and production costs, the thermal expansion coefficient of the collective substrate 1 is preferably $4 \times 10^{-6}$ to $7 \times 10^{-6}/°$ C.

Exemplary materials for the collective substrate 1 satisfying these conditions include insulative ceramic materials such as AlN, $Al_2O_3$, SiC, $Si_3N_4$, BeO and BN. Among these materials, AlN and SiC are particularly preferred for achieving higher heat conductivity, and AlN and $Al_2O_3$ are particularly preferred for reducing a difference in thermal expansion coefficient between the collective substrate 1 and the light emitting element LE1. Further, if a top priority is given to the costs, $Al_2O_3$ is preferred.

Referring to the figures, the electrode layers 31 for mounting a semiconductor element are provided on the main surface 21 of the collective substrate 1, and the electrode layers 32 for connection to a second component are provided on the external connection surface 22. Further, the electrically conductive layers 33 for connection between the electrode layers 31 and the electrode layers 32 are respectively provided on the interior surfaces of the through-holes 11.

The minimum size hole portions 11a of the through-holes 11 are filled by deposition of the electrically conductive material 33a for the electrically conductive layers 33, whereby the through-holes 11 are closed with respect to the thicknesswise of the collective substrate 1 before the insulative members 2 are cut out. This prevents the fluorescent material and/or the protective resin FR from leaking to the opposite side through the through-holes 11 when the light emitting elements LE1 mounted on the electrode layers 31 are sealed. The main surface 21 of the collective substrate 1 mounted with the light emitting elements LE1 can be entirely sealed with the fluorescent material and/or the protective resin FR without the need for sealing only specific regions on the main surface 21. Therefore, the size of the light emitting diode component LE2 can be further reduced.

The thickness $t_1$ of a portion of the electrically conductive material 33a at the minimum size hole portion 11a as measured thicknesswise of the collective substrate 1 is preferably $\frac{1}{50}$ to $\frac{1}{2}$ of the thickness $t_0$ of the collective substrate 1. If the thickness $t_1$ is not less than $\frac{1}{50}$ of the thickness $t_0$ of the collective substrate 1, the fluorescent material and/or the protective resin FR are assuredly prevented from leaking to the external connection surface 22 due to communication of the once closed through-holes 11 which may otherwise occur due to the weight of the sealant during the sealing. If the thickness $t_1$ is not more than $\frac{1}{2}$ of the thickness $t_0$ of the collective substrate 1, the electrically conductive layers 33 each have a sufficient exposed area between the minimum size hole portion 11a and the external connection surface 22, so that the exposed area satisfactorily functions as the solder fillet formation portion.

In order to increase the exposed area of the electrically conductive layer 33 functioning as the solder fillet formation portion and to assuredly prevent the fluorescent material and/or the protective resin FR from leaking to the external connection surface 22 due to the communication of the once closed through-hole 11 which may otherwise occur due to the weight of the sealant during the sealing, the thickness $t_1$ of the portion of the electrically conductive material 33a at the minimum size hole portion 11a as measured thicknesswise of the collective substrate 1 is further preferably $\frac{1}{20}$ to $\frac{1}{5}$ of the thickness $t_0$ of the collective substrate 1.

The thickness $t_2$ of the electrically conductive layer 33 formed on the interior surface of the through-hole 11 is preferably 0.2 to 1.0 time the opening diameter d of the minimum size hole portion 11a. If the thickness $t_2$ is not less than 0.2 time the opening diameter d, the minimum size hole portions 11a can be more efficiently filled with the electrically conductive material 33a when the electrically conductive layers 33 are formed on the interior surfaces of the through-holes 11. Therefore, the leak of the fluorescent material and/or the protective resin FR can be more assuredly prevented.

Even if the thickness $t_2$ is more than 1.0 time the opening diameter d, it is impossible to provide a correspondingly higher effect. Further, an additional amount of the electrically conductive material 33a is required, so that the efficiency of the filling of the minimum size hole portions 11a is reduced. Therefore, the thickness $t_2$ is preferably not more than 1.0 time the opening diameter d. In order to further efficiently fill the minimum size hole portions 11a with the electrically conductive material 33a, the thickness $t_2$ of the electrically conductive layer 33 is further preferably 0.3 to 0.5 times the opening diameter d of the minimum size hole portion 11a.

The regions 1a defined as the insulative members 2 each have two semiconductor element mounting electrode layers 31 spaced from each other in a plane in an isolated state on the main surface 21 of the collective substrate 1. Further, the regions 1a defined as the insulative members 2 each have two external connection electrode layers 32 spaced from each other in a plane in an isolated state on the external connection surface 22 of the collective substrate 1. The two electrode layers 31 on the main surface 21 and the two electrode layers 32 on the external connection surface 22 as opposed each other are respectively connected via the electrically conductive layers 33 respectively provided on the interior surfaces of the through-holes 11 which are provided three by three along outer edges of the region 1a defined as the insulative member 2 of the electrode layers 31, 32.

More specifically, the electrode layers 31, which each have a generally rectangular plane shape, are each formed integrally and connected with extension electrode layers 31b extending from one side edge 31a of the electrode layer 31 to peripheral portions of the openings of the respective through-holes 11 in the main surface 21 and the electrically conductive layers 33 on the interior surfaces of the through-holes 11. Further, the electrode layers 32, which each have a generally rectangular plane shape and partly overlapping with the openings of the through-holes 11 in the external connection surface 22, are integrally formed and connected with the electrically conductive layers 33 on the interior surfaces of the through-holes 11.

The total area of the electrode layers 32 provided on the external connection surface 22 is preferably not less than 30% of the area of the external connection surface 22. When the light emitting diode component LE2 is mounted in a package 7 for a light emitting diode LE3 or a board for a surface light emitting device with the electrode layers 32 on the external connection surface 22 of the semiconductor element mount BL bonded to electrode layers on the package 7 or the board by soldering, sufficient heat dissipation paths can be provided between the semiconductor element mount BL and the package 7 or the board. Therefore, the output of the light emitting diode LE3 can be increased.

In order to provide further sufficient heat dissipation paths, the total area of the electrode layers 32 is preferably not less than 50%, more preferably not less than 70%, of the area of the external connection surface 22. In order to sufficiently isolate the two or more electrode layers 32 from each other when the electrodes are spaced from each other in a plane, the total area of the electrode layers 32 is preferably not more than 90% of the area of the external connection surface 22.

The electrode layers 31, 32 and the electrically conductive layers 33 may have a single layer structure or a multi-layer structure including two or more layers composed of a highly electrically conductive metal material as described above. Pattern formation of the electrode layers 31, 32 is achieved by the same method as described above. Reflective layers composed of Ag, Al, an Al alloy or the like may be provided on surfaces of the electrode layers 31 for reflecting light emitted from the light emitting element LE1, particularly short wavelength light having a wavelength of 600 nm or shorter, at a high reflectivity. Among the aforesaid metal materials, Al is excellent in reflectivity for short wavelength light having a wavelength of 450 nm or shorter, and is preferable for improvement of the light emitting efficiency of a short wavelength light emitting element LE1 which is employed in combination with a fluorescent material for emitting white light.

Where the electrode layers 31 are each formed as having a single layer structure by using any of those metals as the electrically conductive material or formed as having a multi-layer structure including an outermost layer of any of those metals, the provision of the reflective layer may be obviated. Further, solder bonding layers of Au or the like may be provided on surfaces of the electrode layers 32 as described above. Alternatively, the electrode layers 32 may be each formed as having a single layer structure by using Au as the electrically conductive material or formed as having a multi-layer structure including an outermost layer of Au, thereby obviating the provision of the solder bonding layer.

In order to produce the semiconductor element mount BL for mounting the light emitting element LE1 as the semiconductor element and the light emitting diode component LE2 by employing the collective substrate 1, light emitting elements LE1 are respectively mounted on the electrode layers 31 in the regions 1a of the collective substrate 1 and, after the entire surface of the resulting collective substrate 1 is sealed with the fluorescent material and/or the protective resin FR, the region 1b of the collective substrate 1 is removed by dicing or the like. Thus, the remaining regions 1a are separated from each other, whereby semiconductor element mounts BL are produced. At the same time, light emitting diode components LE2 as shown in FIG. 13 are provided. The mounting of the light emitting elements LE1 is achieved by soldering the electrode layers 31 of the semiconductor element mounts BL to electrode layers (not shown) of the light emitting elements LE1 via solder layers SL.

Considering that the light emitting diode components LE2 are each mounted on a package 7 or a board by soldering in a subsequent step, an Au—Sn solder, an Au—Ge solder or an Au—Si solder having a relatively high melting point is preferably used as a solder for the mounting of the light emitting elements LE1. The light emitting elements LE1 may be mounted on the respective semiconductor element mounts BL via Au bumps rather than by the soldering. Alternatively, the light emitting elements LE1 may be mounted on the respective semiconductor element mounts BL with the use of a solder or a bonding paste, and then connected to the electrode layers 31 by wire bonding.

Any of various known protective resins such as epoxy resins and silicone resins may be used as the protective resin for sealing the light emitting elements LE1. In consideration of heat resistance and UV resistance, the silicone resins are particularly preferred. Any of various known fluorescent materials capable of emitting white light when used in combination with the light emitting element LE1 which emits short wavelength light having a wavelength of 600 nm or shorter, particularly 450 nm or shorter, may be used as the fluorescent material. Where the fluorescent material and the protective resin are used in combination, the light emitting elements LE1 mounted on the electrode layers 31 are preferably first sealed with the fluorescent material, which is in turn covered with the protective resin. Alternatively, a mixture of the fluorescent material and the protective resin may be used for the sealing.

The area of the semiconductor element mount BL, i.e., the area of the main surface 21 or the external connection surface 22 of the insulative member 2 in this embodiment, is preferably 1.1 to 4 times the area of the light emitting element LE1 mounted on the main surface 21 (a projection area on the main surface 21). If the area of the semiconductor element mount BL is more than 4 times the area of the light emitting element LE1, it may be impossible to reduce the outer size for space saving. This makes it impossible to handle the light emitting diode component LE2 produced by mounting the light emitting element LE1 on the main surface 21 of the semiconductor element mount BL as a single component like the conventional light emitting element chip to incorporate the light emitting diode component BL2 in the package 7 for the light emitting diode LE3 or to mount the light emitting diode component BL2 on the board for the surface light emitting device. Further, the size of the semiconductor element mount BL is increased, so that a material loss caused when the light emitting element LE1 becomes defective is substantially the same as in the case of a conventional package.

Particularly, the insulative member 2 composed of the aforesaid higher heat conductivity material is expensive, so that the area of the insulative member 2 is preferably minimized within the aforesaid range. For elimination of the material loss, the area of the semiconductor element mount BL is preferably not more than 3.5 times, more preferably not more than 3.0 times the area of the light emitting element LE1 within the aforesaid range.

If the area of the semiconductor element mount BL is less than 1.1 times the area of the light emitting element LE1, the mounting of the light emitting element LE1 will be difficult. Further, there is a possibility that the side faces of the light emitting element LE1 are insufficiently sealed with the protective resin. In order to facilitate the mounting operation and assuredly seal the light emitting element LE1 with the protective resin and the like, the area of the semiconductor element mount BL is preferably not less than 1.3 times, more preferably not less than 1.5 times the area of the light emitting element LE1 within the aforesaid range.

In order to ensure sufficient strength and minimize the volume of the semiconductor element mount BL, the insulative member 2 preferably has a thickness of 0.1 to 1 mm, more preferably 0.2 to 0.5 mm.

The surface light emitting device can be provided by mounting a plurality of light emitting diode components LE2 on the board. Further, the light emitting diode component LE2 may be used as a final product of a light emitting diode device. For example, the light emitting diode component LE2 may be mounted at a desired position of a circuit board such as a printed circuit board or a liquid crystal back light component by soldering through a reflow method thereby to be allowed to function as a light emitting diode.

Referring to FIG. 14, the light emitting diode LE3 can be provided by mounting the aforesaid light emitting diode component LE2 on two electrode layers 72 on a bottom surface of a recess 7a of the package 7 and sealing an opening 7b of the recess 7a with a sealing cap or a lens LS composed of a material pervious to light emitted from the light emitting diode component LE2.

The mounting of the light emitting diode component LE2 is achieved by soldering the electrode layers 32 of the semiconductor element mount BL to the electrode layers 72 of the package 7 via solder layers SL1. At this time, molten solder partly enters the through-holes 11 to be brought into contact with the portions of the electrically conductive layers 33 formed on the second taper surfaces 11c and exposed to side faces 23 of the insulative member 2, thereby forming solder fillets SL2. This improves the mounting reliability.

The package 7 includes a board 70 having the electrode layers 72 on an upper surface thereof as seen in the figure, and a reflective member 71 provided on the board 70 and having a hole serving as the recess 7a. The hole of the reflective member 71 has a generally cone shape which is flared from the bottom surface toward the opening 7b, and its interior surface serves as a reflection surface 71a. The light from the light emitting diode component LE2 is reflected on the reflection surface 71a toward the opening 7b, and efficiently radiated to the outside of the package 7 through the lens LS.

An insulative and heat-resistant substrate such as a ceramic substrate or a glass epoxy substrate is used as the board 70. The reflective member 71 may be entirely composed of a metal or at least the reflection surface 71a of the reflective member 71 may be composed of a metal for efficient reflection of the light emitted from the light emitting diode component LE2.

The through-holes 11 each shown in FIG. 9 may be entirely located within each of the regions 1a of the collective substrate 1. In this case, the taper surfaces 11c are not exposed to the side faces 23 of the insulative member 2, so that the electrically conductive layers 33 formed on the taper surfaces 11c are not required to function as the solder fillet formation portions. Therefore, the through-holes 11 may be completely filled with the electrically conductive material 33a.

Figure 15:
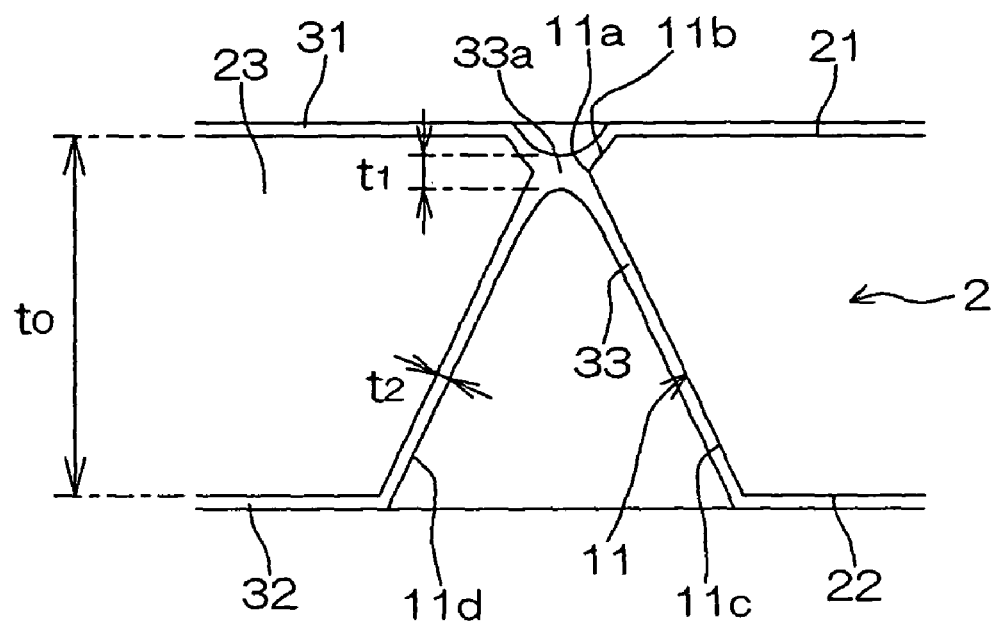
FIG. 15 is an enlarged side view of a through-hole of a semiconductor element mount according to further another embodiment of the present invention as seen in an arrow direction V in FIG. 17.
Figure 16:
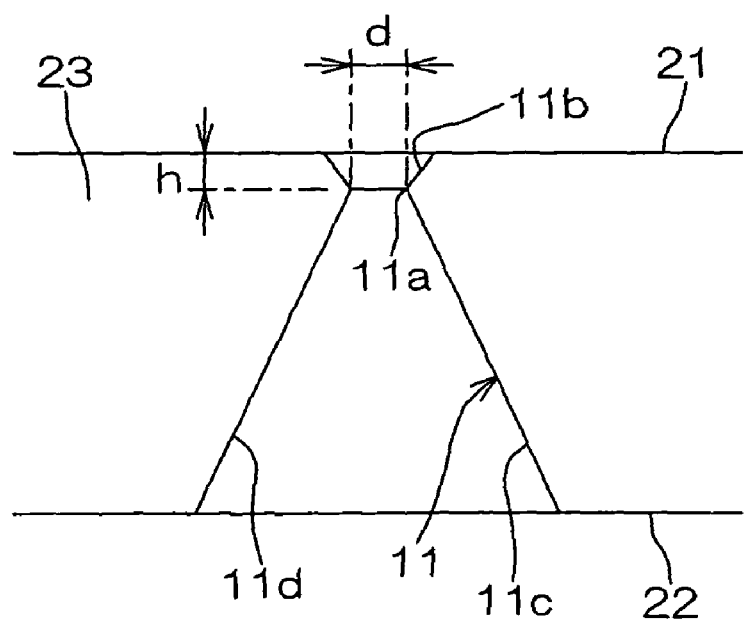
FIG. 16 is a side view illustrating a through-hole before an electrically conductive layer is formed on an interior surface of the through-hole.
Figure 17:
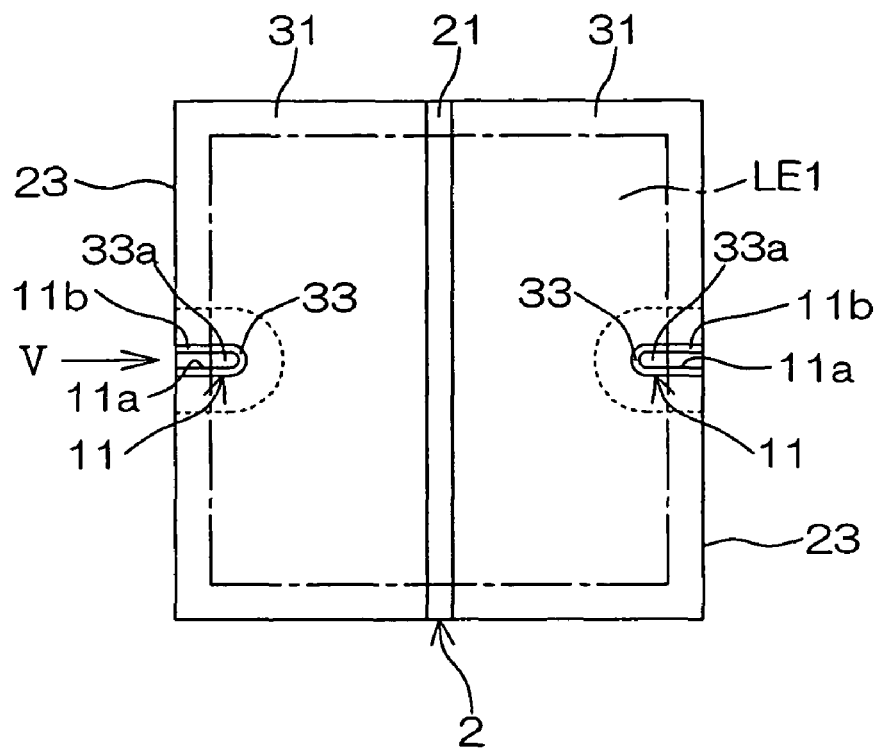
FIG. 17 is a plan view illustrating a main surface of the semiconductor element mount according to the embodiment.
Figure 18:
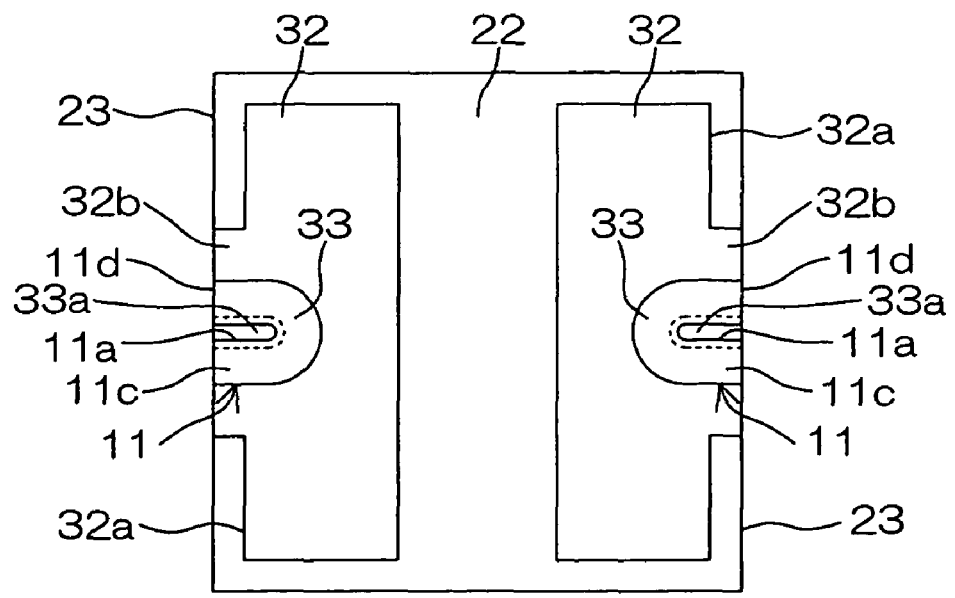
FIG. 18 is a bottom view illustrating an external connection surface.
Figure 19:
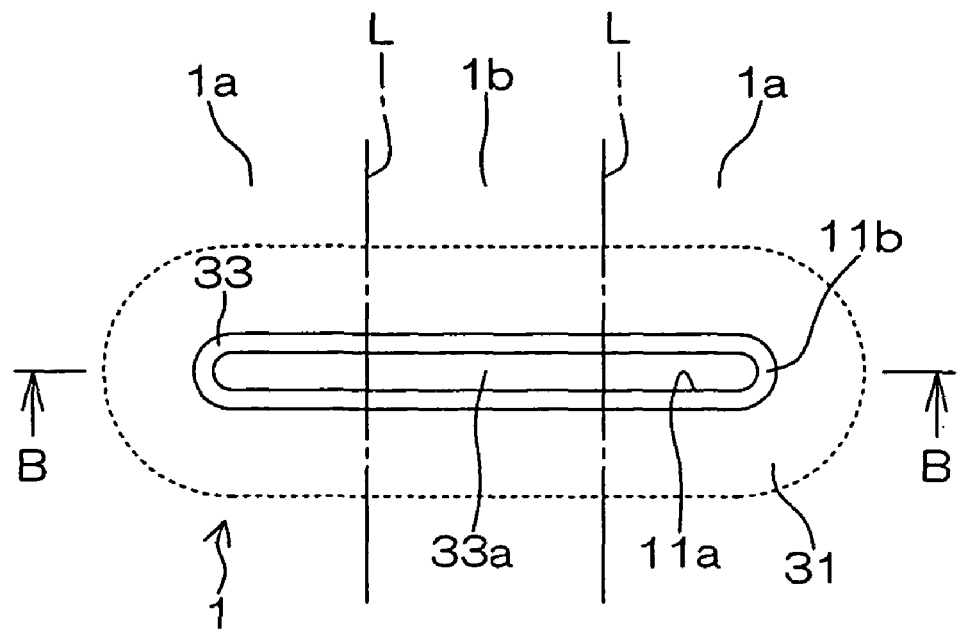
FIG. 19 is an enlarged plan view of a through-hole before an insulative member for the semiconductor element mount according to the embodiment is cut out of a collective substrate.
Figure 20:
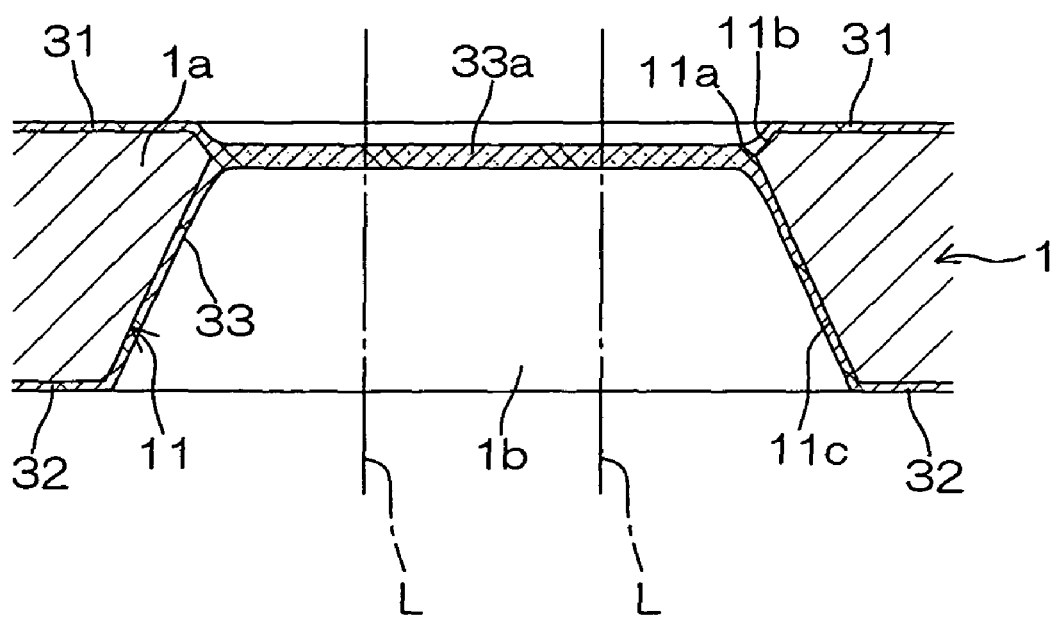
FIG. 20 is a sectional view taken along a line B-B in FIG. 19.

FIG. 15 is an enlarged side view of a through-hole 11 of a semiconductor element mount BL according to further another embodiment of the present invention as seen in an arrow direction V in FIG. 17. FIG. 16 is a side view illustrating a through-hole 11 before an electrically conductive layer 33 is formed on an interior surface of the through-hole 11. FIG. 17 is a plane view illustrating a main surface 21 of the semiconductor element mount BL of this embodiment. FIG. 18 is a bottom view illustrating an external connection surface 22. FIG. 19 is an enlarged plane view of a through-hole 11 before an insulative member 2 for the semiconductor element mount BL of this embodiment is cut out of a collective substrate 1. FIG. 20 is a sectional view taken along a line B-B in FIG. 19.

Referring to these figures, the semiconductor element mount BL of this embodiment has substantially the same construction as the embodiment shown in FIGS. 8 to 14 except for the shape of the through-hole 11. Referring to FIGS. 17 and 18, the semiconductor element mount BL of this embodiment includes a rectangular insulative member 2 having opposite surfaces which respectively serve as a main surface 21, for mounting a light emitting element and an external connection surface 22 for connection to a second component, two electrode layers 31 provided on the main surface 21 of the insulative member 2 for mounting the light emitting element and spaced from each other in a plane in an isolated state, and two electrode layers 32 provided on the external connection surface 22 for connection to the second component and spaced from each other in a plane in an isolated state.

The two electrode layers 31 on the main surface 21 of the insulative member 2 and the two electrode layers 32 provided on the external connection surface 22 as opposed each other are respectively connected via electrically conductive layers 33 formed on interior surfaces of two through-holes 11 respectively provided on peripheral edges of the insulative member 2 of the electrode layers 31, 32 as extending thicknesswise of the insulative member 2.

More specifically, the two electrode layers 31, which each have a generally rectangular plane shape and substantially entirely cover the main surface 21 with a constant width gap defined between the electrode layers 31, are respectively formed integrally and connected with the electrically conductive layers 33 on the interior surfaces of the through-holes 11. The electrode layers 32, which each have a generally rectangular plane shape, are respectively formed integrally and connected with extension electrode layers 32b extending from side edges 32a of the electrode layers 32 to peripheral portions of openings of the through-holes 11 in the external connection surface 22 and the electrically conductive layers 33 on the interior surfaces of the through-holes 11.

Production of the semiconductor element mount BL and a light emitting diode component LE2 having a light emitting element LE1 mounted on the main surface 21 thereof and sealed with a fluorescent material and/or a protective resin is achieved in the same manner as in the aforesaid embodiment by preparing a collective substrate 1 dimensioned so as to include a plurality of insulative members 2, defining a plurality of regions 1a defined as the insulative members 2 are respectively defined on the collective substrate 1 by boundaries L, forming through-holes 11 at predetermined positions in the collective substrate, forming electrode layers 31 and electrode layers 32 on opposite surfaces of the collective substrate, forming electrically conductive layers 33 on interior surfaces of the through-holes 11, mounting light emitting elements LE1 on the electrode layers 31, sealing the light emitting elements LE1 with a fluorescent material and/or a protective resin FR as a sealant, and cutting the resulting collective substrate into the individual regions 1a.

Referring to FIGS. 15, 16, 19 and 20, the through-holes 11 each have an interior surface including two taper surfaces, i.e., first and second taper surfaces 11b, 11c. The first taper surface 11b has a taper shape having an opening width progressively decreasing from the main surface 21 of the insulative member 2 (on an upper side in these figures) to a single minimum size hole portion 11a of an elliptical plane shape provided at a position thicknesswise of the insulative member 2 as having a smaller opening width d than the other portion of the through-hole 11, and has an elliptical opening in the main surface 21. The second taper surface 11c has a taper shape having an opening width progressively decreasing from the external connection surface 22 of the insulative member 2 (on a lower side in these figures) to the minimum size hole portion 11a, and has an elliptical opening in the external connection surface 22.

The through-holes 11 are each formed in the collective substrate 1 as extending across two regions 1a later serving as semiconductor element mounts BL and defined by boundaries L and a region 1b to be removed by dicing or the like between the regions 1a. When the electrically conductive layers 33 are formed on the interior surfaces of the through-holes 11, an electrically conductive material 33a for the electrically conductive layers 33 is deposited on and fill the minimum size hole portions 11a, whereby the through-holes 11 are closed with respect to the thicknesswise of the collective substrate 1 as shown in FIGS. 19 and 20 before the collective substrate 1 is cut.

Therefore, when the light emitting elements LE1 are mounted on the electrode layers 31 and sealed, the fluorescent material and/or the protective resin FR are prevented from leaking to the opposite side through the through-holes 11. For example, the main surface 21 of the collective substrate 1 mounted with the light emitting elements LE1 can be entirely sealed with the fluorescent material and/or the protective resin FR without the need for sealing only specific regions on the main surface 21. Therefore, the size of the light emitting diode component LE2 can be further reduced.

When the region 1b is removed to separate the regions 1a from each other by dicing or the like, portions of the electrically conductive layers 33 formed on the second taper surfaces 11c are exposed to side faces 23 of the insulative members 2 of the semiconductor element mounts BL through openings 11d as shown in FIGS. 15 to 18. The exposed portions of the electrically conductive layers 33 function as solder fillet formation portions. Therefore, when the light emitting diode component LE2 is mounted on the second component, e.g., a package 7 for a light emitting diode LE3, by soldering, the resulting solder fillets reinforce the external connection electrode layers 32, thereby improving the mounting reliability.

The through-holes 11 each having the illustrated shape are preferably formed by the sandblast method. That is, elliptical regions on one surface of the collective substrate 1 corresponding to the openings of the through-holes 11 in the external connection surface 22 are exposed without protection by a resist film, and the exposed regions of the collective substrate 1 are selectively removed in the thicknesswise direction by the sandblast method for formation of the second taper surfaces 11c. Similarly, elliptical regions on the other surface of the collective substrate 1 corresponding to the openings of the through-holes 11 in the main surface 21 are exposed without protection by a resist film, and the exposed regions of the collective substrate 1 are selectively removed in the thicknesswise direction by the sandblast method for formation of the first taper surfaces 11b. Since a feature of the sandblast method is that the size of the resulting hole decreases with the depth of the hole, the through-holes 11 are formed as having a shape shown in FIGS. 19 and 20.

The through-holes 11 preferably each have dimensions in substantially the same ranges as described above for the aforesaid reasons. Referring to FIGS. 15 and 16, the position of the minimum size hole portion 11a with respect to the thicknesswise of the insulative member 2 is preferably such that a distance h between the main surface 21 and the minimum size hole portion 11a is more than zero and not more than $2/3$ of the thickness $t_0$ of the insulative member 2, more preferably not more than $1/2$ of the thickness $t_0$ of the insulative member 2 further more preferably about 5 μm to about 50 μm. The opening width d of the minimum size hole portion 11a is preferably 10 to 200 μm, more preferably 50 to 150 μm, further more preferably 75 to 125 μm. The term "opening width d" herein means a width of the elliptical shape which includes a rectangular center portion and semicircular portions respectively connected to opposite edges of the center portion, the width being measured perpendicularly to a center line extending through the centers of the semicircular portions.

The thickness $t_1$ of a portion of the electrically conductive material 33a at the minimum size hole portion 11a as measured thicknesswise of the insulative member 2 is preferably $1/50$ to $1/2$, more preferably $1/20$ to $1/5$ of the thickness $t_0$ of the insulative member 2. The thickness $t_2$ of the electrically conductive layer 33 provided on the interior surface of the through-hole 11 is preferably 0.2 to 1.0 time, more preferably 0.3 to 0.5 times the opening width d of the minimum size hole portion 11a.

Portions other than the through-holes 11 preferably each have dimensions in substantially the same ranges as described above for the aforesaid reasons. That is, the area of the main surface 21 or the external connection surface 22 of the insulative member 2 is preferably 1.1 to 4 times, more preferably 1.3 to 3.5 times, further more preferably 1.5 to 3.0 times the area of the light emitting element LE1 mounted on the main surface 21 (a projection area on the main surface 21). The insulative member 2 preferably has a thickness of 0.1 to 1 mm, more preferably 0.2 to 0.5 mm.

The total area of the electrode layers 32 provided on the external connection surface 22 is preferably not less than 30%, more preferably not less than 50%, further more preferably not less than 70%, and not more than 90% of the area of the external connection surface 22.

The electrode layers 31, 32 and the electrically conductive layers 33 are formed of any of various known highly electrically conductive metal materials as having a single layer structure or a multi-layer structure including two or more layers by any of various metallization methods including wet plating methods and physical vapor deposition methods such as vacuum vapor deposition methods and sputtering methods. At least surface portions of the electrode layers 31 are preferably composed of Ag, Al, an Al alloy or the like, and at least surface portions of the electrode layers 32 are preferably composed of Au.

The insulative member 2 is preferably composed of a ceramic material having a heat conductivity of not less than 10 W/mK and a thermal expansion coefficient of not more than $1 \times 10^{-6}$/° C. Semiconductor element mounts BL of this embodiment each including the ceramic insulative member 2 are preferably produced by firing a ceramic precursor material (a ceramic green sheet or the like) for the insulative members 2 to prepare a planar collective substrate 1, and forming the through-holes 11, the electrode layers 31, 32 and the electrically conductive layers 33 in/on the collective substrate 1 by post processing.

Light emitting diode components LE2 are produced, as described above, by defining a plurality of regions 1a on a collective substrate 1 dimensioned so as to include a plurality of insulative members 2, forming through-holes 11 at predetermined positions in the collective substrate 1, forming electrode layers 31 on one surface of the collective substrate, forming electrode layers 32 on the other surface of the collective substrate, forming electrically conductive layers 33 on the interior surfaces of the through-holes 11, depositing an electrically conductive material 33a to fill minimum size hole portions 11a of the through-holes 11, mounting light emitting elements LE1 on the electrode layers 31, sealing the light emitting elements LE1 with a fluorescent material and/or a protective resin FR, and cutting the resulting collective substrate into the individual regions 1a. Thus, the production of the light emitting diode components LE2 can be achieved simultaneously with the production of the semiconductor element mounts BL.

A surface light emitting device can be produced by mounting a plurality of such light emitting diode components LE2 on a board. Further, the light emitting diode component LE2 may be used as a final product of a light emitting diode device. For example, the light emitting diode component LE2 may be mounted at a desired position of a circuit board such as a printed circuit board or a liquid crystal back light component by soldering through a reflow method thereby to be allowed to function as a light emitting diode.

Further, a light emitting diode LE3 can be provided by mounting the light emitting diode component LE2 on two electrode layers 72 provided on a bottom surface of a recess 7a of a package 7 as shown in FIG. 14 via a solder layer SL1 by soldering, and sealing an opening 7b of the recess 7a with a sealing cap or a lens LS composed of a material pervious to light emitted from the light emitting diode component LE2. At this time, molten solder partly enters the through-holes 11 to be brought into contact with the portions of the electrically conductive layers 33 formed on the second taper surfaces 11c and exposed to side faces 23 of the insulative member 2, thereby forming solder fillets SL2. This improves the mounting reliability.

Figure 21:
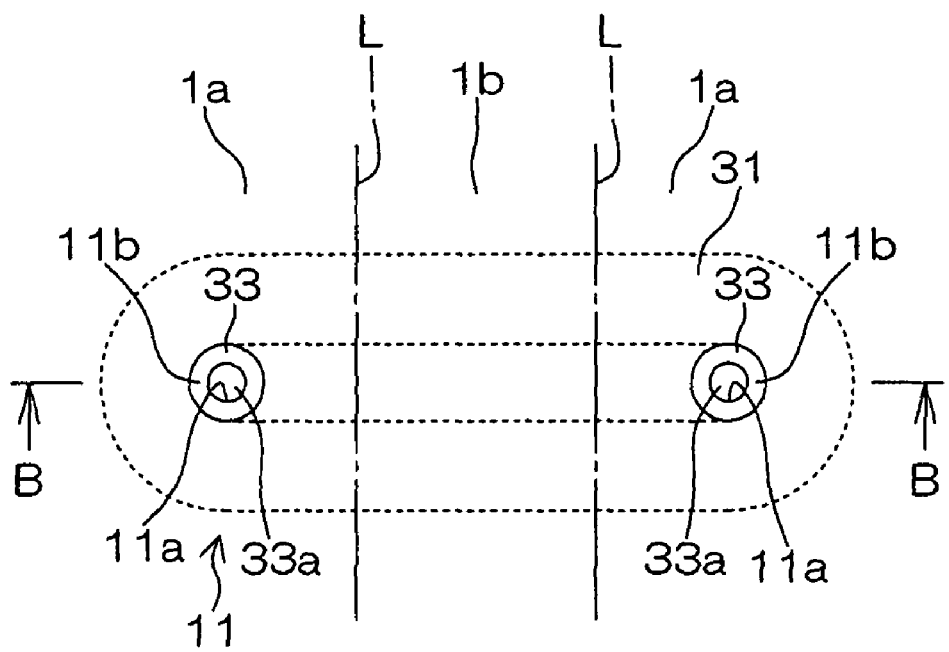
FIG. 21 is an enlarged plan view of a modification of the through-hole.
Figure 22:
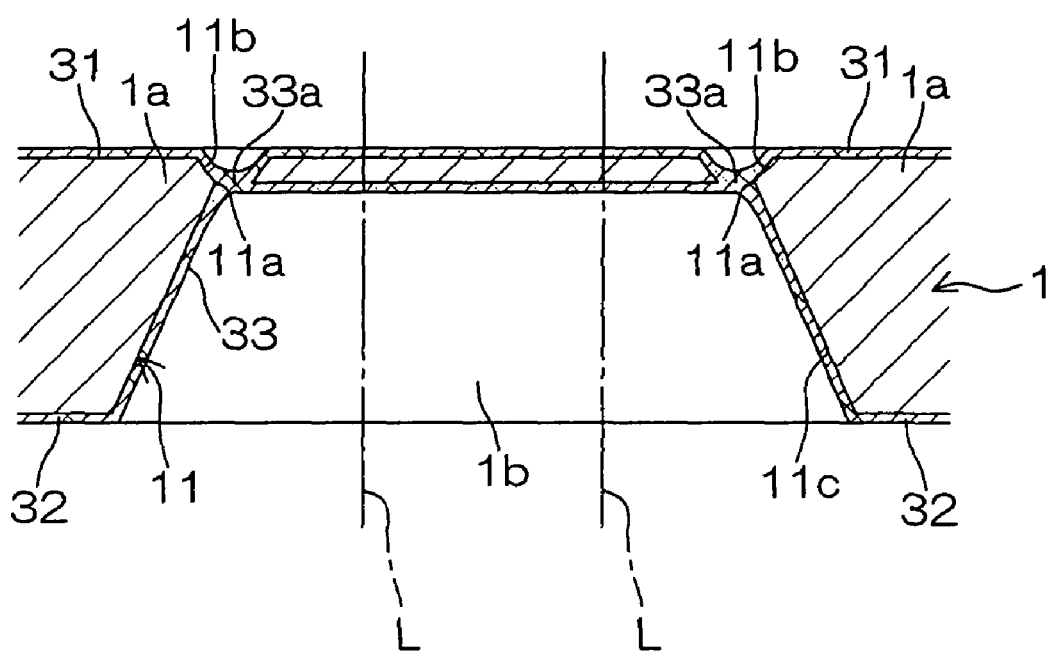
FIG. 22 is a sectional view taken along a line B-B in FIG. 21.

As shown in FIGS. 21 and 22, the through-holes 11 may each have an interior surface including cone-like taper portions as shown in FIGS. 9 and 10 and a taper portion as shown in FIGS. 19 and 20 in combination. That is, the interior surface of the through-hole 11 includes two first taper surfaces 11b respectively provided in two adjacent regions 1a each later serving as a semiconductor light emitting element mount BL, and a single second taper surface 11c extending across a region 1b between the two regions 1a and connected to the two first taper surfaces 11b through two minimum size hole portions 11a respectively provided in the two regions 1a.

The two first taper surfaces 11b each have a cone-like taper shape having an opening diameter progressively decreasing from a main surface 21 of the insulative member 2 (on an upper side in the Figure) to the minimum size hole portion 11a of a round plane shape, and each have a round opening in the main surface 21 in the region 1a. The second taper surface 11c is tapered as having an elliptical plane shape including a rectangular center portion and semicircular portions provided on opposite edges of the center portion concentrically with the two minimum size hole portions 11a, and having a previously defined opening width progressively decreasing from the external connection surface 22 of the insulative member 2 (on a lower side in the Figure) to the two minimum size hole portions 11a, and has an elliptical opening in the external connection surface 22 across a region 1b between the two regions 1a.

The through-holes 11 are preferably formed by the sandblast method. That is, elliptical regions on one surface of the collective substrate 1 corresponding to the openings of the through-holes 11 in the external connection surface 22 are exposed without protection by a resist film, and the exposed regions of the collective substrate 1 are selectively removed in the thicknesswise direction by the sandblast method for formation of the elliptical second taper surfaces 11c. Similarly, round regions on the other surface of the collective substrate corresponding to the openings of the through-holes 11 in the main surface 21 are exposed without protection by a resist film, and the exposed regions of the collective substrate 1 are selectively removed in the thicknesswise direction by the sandblast method for formation of the two first taper surfaces 11b at opposite ends of each of the elliptical second taper surfaces 11c. Since a feature of the sandblast method is that the size of the resulting hole decreases with the depth of the hole, the through-holes 11 are each formed as having a shape shown in FIGS. 21 and 22.

When the electrically conductive layers 33 are formed on the interior surfaces of the through-holes 11, an electrically conductive material 33a for the electrically conductive layers 33 is deposited on and fill the minimum size hole portions 11a, whereby the through-holes 11 are closed with respect to the thicknesswise of the collective substrate 1 before the collective substrate 1 is cut. Therefore, the fluorescent material and/or the protective resin FR are prevented from leaking to the opposite side through the through-holes 11. When the region 1b between the adjacent regions 1a is removed to separate the regions 1a from each other to provide the insulative members by dicing or the like, portions of the electrically conductive layers 33 formed on the second taper surfaces 11c of the through-holes 11 are exposed to side faces 23 of the insulative members 2 thereby to be allowed to function as solder fillet formation portions. The through-holes 11 and other portions preferably each have dimensions in substantially the same ranges as in the two preceding embodiments for the aforesaid reasons.

It should be understood that the present invention be not limited to the embodiments described above with reference to the drawings, but various modifications may be made without departing from the scope of the present invention.

What is claimed is:

1. A semiconductor element mount, comprising:
    a planar ceramic insulative member having opposite surfaces which respectively serve as a main surface for mounting a semiconductor element and an external connection surface for connection to a second component, and a through-hole extending thicknesswise thereof and having a single minimum size hole portion located at a position defined with respect to a thickness thereof, the through-hole having an interior surface tapered such that an opening size thereof progressively decreases from openings of the through-hole in the main surface and the external connection surface toward the minimum size hole portion;
    an electrode layer provided on the main surface of the insulative member for mounting the semiconductor element;
    a pair of electrode layers provided on the external connection surface for connection to the second component; and
    an electrically conductive layer provided on the interior surface of the through-hole for connection between the electrode layer on the main surface and the electrode layers on the external connection surface,
    the through-hole being closed by the insulative member itself on a main surface side end of a side face thereof.

2. A semiconductor element mount as set forth in claim 1, wherein the insulative member has a heat conductivity of not less than 10 W/mK.

3. A semiconductor element mount as set forth in claim 1, wherein the insulative member has a thermal expansion coefficient of not more than $10 \times 10^{-6}/°C$.

4. A semiconductor element mount as set forth in claim 1, wherein the insulative member is composed of one of AlN, $Al_2O_3$ and SiC.

5. A semiconductor element mount as set forth in claim 1, wherein the insulative member has a thickness of 0.1 to 1 mm.

6. A semiconductor element mount as set forth in claim 1, wherein the interior surface of the through-hole includes:
    a first taper surface having an opening diameter progressively decreasing from the main surface toward the minimum size hole portion, and opening in the main surface; and
    a second taper surface having an opening diameter progressively decreasing from the external connection surface toward the minimum size hole portion, and opening in the external connection surface, the first taper surface meets the main surface at an obtuse angle $\theta_1$, the second taper surface meets the external connection surface at an obtuse angle $\theta_2$ and the first taper surface meets the second taper surface at an obtuse angle $\theta_3$.

7. A semiconductor element mount as set forth in claim 1, wherein a distance h between the main surface and the minimum size hole portion of the insulative member as measured thicknesswise of the insulative member satisfies the following expression:

$$0 < h \leq \tfrac{2}{3} t_0$$

wherein $t_0$ is the thickness of the insulative member.

8. A semiconductor element mount as set forth in claim 1, wherein the minimum size hole portion has a round plan shape having an opening diameter of 10 to 200 μm.

9. A semiconductor element mount as set forth in claim 1, wherein at least a part of the through-hole opens in a side surface of the insulative member which meets the main surface and the external connection surface.

10. A semiconductor element mount as set forth in claim 1, wherein the minimum size hole portion of the through-hole is filled with an electrically conductive material which forms the electrically conductive layer, and the through-hole is closed with respect to the thickness of the insulative member.

11. A semiconductor element mount as set forth in claim 1, wherein the through-hole is entirely closed with respect to a side surface of the insulative member which meets the main surface and the external connection surface.

12. A semiconductor element mount as set forth in claim 1, wherein the through-hole is entirely filled with an electrically conductive material which forms the electrically conductive layer, and is closed with respect to the thickness of the insulative member.

13. A semiconductor element mount as set forth in claim 1, wherein at least a part of an outermost surface of the electrode layer on the external connection surface is composed of Au.

14. A semiconductor element mount as set forth in claim 1, wherein at least a part of an outermost surface of the electrode layer on the main surface is composed of one of Ag, Au, Al and an Al alloy.

15. A semiconductor element mount as set forth in claim 14, wherein the electrode layer on the main surface has a multi-layer structure including:

(I) an adhesion layer composed of one of Ti, Cr, NiCr, Ta and a compound of any of these metals;

(II) a diffusion prevention layer composed of one of Pt, Pd, Cu, Ni, Mo and NiCr; and (III) a surface layer composed of one of Ag, Al and Au, and the layers (I), (II) and (III) are stacked in this order on the insulative member.

16. A semiconductor element mount as set forth in claim 15, wherein the adhesion layer has a thickness of 0.01 to 1.0 μm, the diffusion prevention layer has a thickness of 0.01 to 1.5 μm, and the surface layer has a thickness of 0.1 to 10 μm.

17. A semiconductor element mount as set forth in claim 1, further comprising an Au bonding pad provided on the electrode layer on the main surface.

18. A semiconductor element mount as set forth in claim 1, wherein the insulative member has a semiconductor element mount region defined on the main surface thereof, the semiconductor element mount further comprising:

a frame provided on the main surface of the insulative member as surrounding the semiconductor element mount region.

19. A semiconductor element mount as set forth in claim 18, wherein the insulative member and the frame each have a thermal expansion coefficient of not more than $10 \times 10^{-6}/°C$., and a difference in thermal expansion coefficient between the frame and the insulative member is not more than $3 \times 10^{-6}/°C$.

20. A semiconductor element mount as set forth in claim 18, wherein not less than 80% of an area of the semiconductor element mount region surrounded by the frame on the main surface of the insulative member is covered with a metal layer at least including the semiconductor element mounting electrode layer.

21. A semiconductor device comprising:

a semiconductor element mount as recited in claim 1; and a semiconductor element mounted on the main surface of the insulative member of the semiconductor element mount.

22. A semiconductor device as set forth in claim 21, wherein the semiconductor element is sealed with a sealant.

23. A semiconductor device as set forth in claim 21, wherein the main surface of the insulative member of the semiconductor element mount has an area which is 1.1 to 4 times a projection area of the semiconductor element on the main surface.

24. A light emitting diode component comprising:

a semiconductor device as recited in claim 23, wherein the semiconductor element is a light emitting element, and the sealant is at least one of a fluorescent material and a protective resin.

25. A light emitting diode comprising:

a package having a recess;

a light emitting diode component as recited in claim 24, mounted on a bottom surface of the recess of the package; and one of a sealing cap and a lens composed of a material pervious to light emitted from the light emitting diode component and fitted in an opening of the recess for sealing the recess.

26. An imaging device comprising:

a semiconductor element mount as recited in claim 18;

an imaging element mounted as the semiconductor element in the region surrounded by the frame on the main surface of the insulative member of the semiconductor element mount; and a cover of a transparent plate bonded to an upper surface of the frame for sealing an inside of the frame.

* * * * *